(12) United States Patent
Fields

(10) Patent No.: US 7,875,523 B1
(45) Date of Patent: Jan. 25, 2011

(54) HBT WITH EMITTER ELECTRODE HAVING PLANAR SIDE WALLS

(75) Inventor: Charles H. Fields, Calabasas, CA (US)

(73) Assignee: HRL Laboratories, LLC, Malibu, CA (US)

(*) Notice: Subject to any disclaimer, the term of this patent is extended or adjusted under 35 U.S.C. 154(b) by 483 days.

(21) Appl. No.: 11/156,079

(22) Filed: Jun. 16, 2005

Related U.S. Application Data

(60) Provisional application No. 60/619,122, filed on Oct. 15, 2004, provisional application No. 60/619,123, filed on Oct. 15, 2004.

(51) Int. Cl.
*H01L 21/331* (2006.01)

(52) U.S. Cl. .......... 438/343; 438/317; 438/320; 438/364; 257/E21.371

(58) Field of Classification Search ......... 438/309–363, 438/364; 257/197, 198, E21.371
See application file for complete search history.

(56) References Cited

U.S. PATENT DOCUMENTS

| | | | |
|---|---|---|---|
| 4,977,435 A | 12/1990 | Yoshimura | 257/194 |
| 5,206,524 A | 4/1993 | Chen et al. | 257/29 |
| 5,296,733 A | 3/1994 | Kusano et al. | 257/586 |
| 5,298,439 A | 3/1994 | Liu et al. | 438/319 |
| 5,371,022 A | 12/1994 | Hsieh et al. | 438/311 |
| 5,618,754 A | 4/1997 | Kasahara | 438/653 |
| 5,670,801 A * | 9/1997 | Nakano | 257/198 |
| 5,804,487 A | 9/1998 | Lammert | 438/319 |
| 5,994,194 A | 11/1999 | Lammert | 438/319 |
| 6,271,097 B1 | 8/2001 | Morris | 438/312 |
| 6,458,668 B1 | 10/2002 | Yoon et al. | 438/312 |
| 6,462,362 B1 | 10/2002 | Miyoshi | 257/198 |
| 6,528,378 B2 | 3/2003 | Hirata | 438/317 |
| 6,765,242 B1 * | 7/2004 | Chang et al. | 257/197 |
| 6,815,304 B2 | 11/2004 | Sankin et al. | 438/438 |
| 6,855,613 B1 | 2/2005 | Hamm et al. | 438/312 |
| 6,924,201 B2 | 8/2005 | Tanomura et al. | 438/312 |
| 7,001,820 B1 | 2/2006 | Miyajima et al. | 438/312 |
| 7,030,462 B2 | 4/2006 | Yagura et al. | 257/565 |
| 2001/0011729 A1 | 8/2001 | Singh et al. | 257/77 |
| 2001/0042867 A1 | 11/2001 | Furuhata | 257/197 |
| 2002/0020851 A1 | 2/2002 | Sakuma | 257/197 |
| 2002/0066909 A1 | 6/2002 | Tanomura | 257/197 |
| 2002/0081531 A1 | 6/2002 | Jain | 430/322 |
| 2002/0142597 A1 | 10/2002 | Park et al. | 438/689 |
| 2002/0155670 A1 | 10/2002 | Malik | 438/112 |
| 2003/0077870 A1 | 4/2003 | Yoon et al. | 438/312 |
| 2003/0077898 A1 * | 4/2003 | Pullela | 438/637 |
| 2003/0160302 A1 | 8/2003 | Sankin et al. | 257/565 |

(Continued)

OTHER PUBLICATIONS

Andre, P., et al., "InGaAs/InP DHBT Technology and Design Methodology for Over 40 Gb/s Optical Communication Circuits," *IEEE Journal of Solid-State Circuits*, vol. 36, No. 9, pp. 1321-1327 (Sep. 2001).

(Continued)

*Primary Examiner*—Wael M Fahmy
*Assistant Examiner*—Minchul Yang
(74) *Attorney, Agent, or Firm*—Ladas & Parry

(57) ABSTRACT

A heterojunction bipolar transistor is formed with an emitter electrode that comprises an emitter epitaxy underlying an emitter metal cap and that has horizontal dimensions that are substantially equal to the emitter metal cap.

16 Claims, 30 Drawing Sheets

U.S. PATENT DOCUMENTS

| | | | | |
|---|---|---|---|---|
| 2003/0203583 A1* | 10/2003 | Malik | .......................... | 438/312 |
| 2004/0041235 A1 | 3/2004 | Yanagihara et al. | ......... | 257/565 |
| 2005/0035370 A1 | 2/2005 | Chen | .......................... | 257/198 |
| 2005/0145884 A1 | 7/2005 | Nogome | ..................... | 257/197 |
| 2006/0284282 A1* | 12/2006 | Cunningham | ............... | 257/565 |

OTHER PUBLICATIONS

Broekaert, T.P.E., et al., "InP-HBT Optoelectronic Integrated Circuits for Photonic Analog-to-Digital Conversion," *IEEE Journal of Solid-State Electronics*, vol. 36, No. 9, pp. 1335-1342 (Sep. 2001).

Hafizi, M., et al., "Submicron Fully Self-Aligned AlInAs/GaInAs HBTs For Low-Power Applications," *Device Research Conference*, pp. 80-81 (Jun. 19-21, 1995).

Jensen, J.F., et al., "AlInAs/GaInAs HBT IC Technology," *IEEE Custom Integrated Circuits Conference*, pp. .18.2.1-18.2.4 (1990).

Jensen, J.F., et al., "High Speed Dual Modulus Dividers Using AlInAs-GaInAs HBT • IC Technology," *GaAsIC Symposium*, pp. 41-44 (Oct. 7-10, 1990).

Liu, W., *Handbook of III-V Heterojunction Bipolar Transistors*, John Wiley & Sons, Inc., New York, New York, pp. 206-211 (1998).

Mokhtari, M., et al., "100+ GHz Static Divide-by-2 Circuit in InP-DHBT Technology," IEEE Journal of Solid-State Circuits, vol. 38, No. 9, pp. 1540-1544 (Sep. 2003).

Sokolich, M., et al., "A Low-Power 72.8-GHz Static Frequency Divider in AlInAs/InGaAs HBT Technology," *IEEE Journal of Solid-State Circuits*, vol. 36, No. 9, pp. 1328-1334 (Sep. 2001).

U.S. Appl. No. 10/966,219, filed Oct. 15, 2004, Fields.

U.S. Appl. No. 10/966,222, filed Oct. 15, 2004, Fields.

U.S. Appl. No. 11/156,078, filed Jun. 16, 2005, Fields.

* cited by examiner

Image Reversal Photolithography

PRIOR ART

PRIOR ART

PRIOR ART

PRIOR ART

Embodiment II

Image Reversal Photolithography

HBT WITH EMITTER ELECTRODE HAVING PLANAR SIDE WALLS

RELATED APPLICATIONS

This application is related to, and claims the priority of, U.S. Ser. No. 60/619,122 and 60/619,123, both filed on Oct. 15, 2004.

STATEMENT OF GOVERNMENT INTEREST

This disclosure was made with government support under Contract No. F33615-02-C-1286 awarded by the Air Force Research Laboratory. The government has certain rights in this disclosure.

TECHNICAL FIELD

This disclosure relates to a non-self-aligned heterojunction bipolar transistor (HBT) and a method for preparing a non-self-aligned HBT.

BACKGROUND

The use of self-aligned contacts in the HBT process is intended to minimize the base access resistance of the device. The use of this technique is known in that fabrication of early HBTs utilized contact lithography or early broadband wafer stepper systems for device fabrication. These systems are capable of limited layer-to-layer registration and therefore, the only technique available to minimize contact spacing was to employ the technique of self-aligned contacts. Large circuit demonstrating yield of known devices is described in T. P. Broekaert, W. Ng, J. F. Jensens, D, Yap, D. L. Persechini, S. Bourgholtaer, C. H. Fields, Y. K. Brown-Boegeman, B. Shi, and R. H. Walden, "InP-HBT Optoelectronic Integrated Circuits for Photonic Anaolog-to-digital Conversion", IEEE Journal of Solid-State Circuits, Vol. 36, No. 9, September 2001, pp. 1335-1342, which is incorporated herein by reference.

While self-aligned HBT devices do demonstrate lower base resistance, this technique is prone to variations in device Beta due to lateral diffusion of minority carriers in the base and recombination at the base metal (BMET) contact which leads to variations in the base current of these devices. Since variations in base current lead to variations in Beta, the HBTs fabricated using self-aligned contacts demonstrate a large range of measured Beta.

A description of general HBT devices can be found in Jensen, J. F.; Stanchina, W. E.; Metzger, R. A.; Rensch, D. B.; Pierce, M. W.; Kargodorian, T. V.; Allen, Y. K., "AlInAs/GaInAs HBT IC technology", Custom Integrated Circuits Conference, 1990, Proceedings of the IEEE 1990, 13-16 May 1990, Pages: 18.2/1-18.2/4, which is incorporated herein by reference.

Another general description of a HBT device is disclosed by Hafizi, M.; Stanchina, W. E.; Sun, H. C., "Submicron fully self-aligned AlInAs/GaInAs HBTs for low-power applications", Device Research Conference, 1995. Digest. 1995 53rd Annual, 19-21 Jun. 1995, Pages: 80-81, which is incorporated herein by reference.

Jensen, J. F.; Stanchina, W. E.; Metzger, R. A.; Rensch, D. B.; Allen, Y. K.; Pierce, M. W.; Kargodorian, T. V, "High speed dual modulus dividers using AlInAs-GaInAs HBT IC technology", Gallium Arsenide Integrated Circuit (GaAs IC) Symposium, 1990. Technical Digest 1990, 12th Annual, 7-10 Oct. 1990, Pages 41-44 describe a general HBT device as well, which is incorporated herein by reference.

Base-emitter shorts are a leading limitation to HBT IC yield. Shorts due to metal spiting during the self-aligned base metal deposition occurs in about 1 in 600 transistors and limits current HBT IC yield to below 2000 transistors. The use of non-self-aligned emitter-base contacts eliminates the possibility of shorting of this type.

In HBTs designed for high-speed applications, current gain is not determined solely by recombination in the bulk of the base epitaxial layer. Both surface and bulk components of base current combine to decrease the overall device current gain. InP HBTs known in the state of the art employ self-aligned base-emitter structures to reduce the extrinsic base resistance and the base-collector junction capacitance. This alignment technique results in narrow contact spacing and potentially large values of surface recombination. Handbook of III-V Heterojunction Bipolar Transistors, W. Liu, 1998 Wiley & Sons, FIGS. 3-54 & 3-55 shows that Beta is extremely sensitive to the spacing of the emitter and base contacts for values closer than about 1500 Å. In this range, minor variations in wet etch isotropy or in metal deposition source angle could lead to wildly varying values of Beta. In a self-aligned HBT, the emitter-base spacing can even approach zero.

The mechanism for reduction and variation in Beta is shown in FIG. 1. FIG. 1 shows that electrons, which are emitted by the emitter epitaxial layer 2, migrate through the base layer 1 to the collector layer 5. A minority of electrons however laterally diffuses and does not reach the collector layer 5 and instead migrates to the base metal 4. Any electron that reaches the base metal 4 instead of collector layer 5 causes reduction and variation in device Beta.

FIG. 11 is a schematic depiction of a state-of-the-art self-aligned (SA) transistor that is currently being fabricated according to the prior art. The BMET layer 4 is a large square which completely overlays the emitter metal (EMET) 3 pattern. The current, known process of manufacturing the SA transistor is shown in FIG. 6 to FIG. 11. First, a patterned emitter metal layer 2 is formed to yield an emitter metal cap 3 as shown in FIG. 6. This process can be carried out in two different ways. According to one method (1) a photoresist 4 is applied on the emitter layer and (2) exposed through a mask and (3) the exposed photoresist 4 is removed leaving a space pattern in the photoresist 4 for the emitter metal cap 3 and (4) emitter metal is deposited on the top surface of the wafer and (5) the photoresist 4 and the emitter metal covering the photoresist 4 is removed leaving the emitter metal cap 3 and the base layer 1. According to a second method (1) an emitter metal layer is deposited on the emitter epitaxial layer 2, (2) photoresist is applied on the emitter metal layer, and (3) exposed through a mask and (4) the exposed photoresist 4 is removed leaving a photoresist 4 on the emitter metal layer for the emitter metal cap 3 and (4) emitter metal which is not covered by the photoresist 4 is removed and (5) the photoresist 4 covering the emitter metal cap 3 is removed leaving the emitter metal cap 3 and the base layer 1.

In a further process step the emitter epitaxial layer 2 is etched off to yield an emitter epitaxy 2 below and in line with emitter metal cap 3. FIG. 7 shows an emitter epitaxy 2 below and in line with the emitter metal cap 3, wherein the emitter epitaxy has an undercut Δ. The undercut Δ is obtained by two etch process steps, a wet etch and a dry etch. The undercut Δ is necessary for devices according to the prior art between the base metal 4 and the emitter epitaxy 2 as shown in FIGS. 10 and 11. The emitter epitaxy 2 is in the form of a pedestal and together with the overlying emitter metal cap 3 form the emitter electrode of the HBT. In a next step, a photoresist layer 8 is applied on the base layer 1 covering the base layer 1 and emitter epitaxy 2 and emitter metal cap 3 as shown in FIG. 8.

The next process is carried out according to image reversal photolithography as follows. The photoresist layer 8 is irradiated by light or electron beam 10 through a mask 9. The mask 9 covers the area overlying the emitter metal cap 3 that is thus not irradiated. After irradiation, the surface of the photoresist layer 8 that was irradiated through the mask 9 becomes impervious to removal. The area of the photoresist 8 that was covered and therefore not irradiated is susceptible to removal, as shown in FIG. 8. After removing the susceptible area of the photoresist 8, part of the base layer 1, the emitter epitaxy 2 and the emitter metal cap 3 are no longer covered by the photoresist layer 8 and are thus exposed, as shown in FIG. 9. In the next step, base metal 4 is applied on the entire top surface as shown in FIG. 10. In the next step the photoresist 8 is removed together with the base metal 4 on top of the photoresist 8 as shown in FIG. 11. The emitter electrode comprised of emitter epitaxy 2 and emitter metal cap 3 is covered by the base metal 4. The base metal 4 is spaced a certain distance from the emitter epitaxy 2 in order to avoid electrical shorting between the base metal 4 and the emitter epitaxy 2. Such shorting is avoided by the provision of the emitter epitaxy 2 undercut Δ. However, due to the undercut Δ of the emitter epitaxy 2, the contact area between the emitter epitaxy 2 and the emitter metal cap 3 is reduced.

It is therefore desirable to be able to produce an HBT that reduces shorting between the base metal 4 and the emitter epitaxy 2, that solves the recurring problem of low and varying values of current gain (Beta), and that further solves the problem of variations in HBT Beta from wafer to wafer, variations in HBT Beta within a single wafer and from wafer to wafer. Base emitter shorts, which occur in about 1 our of every 600 transistors, lead to poor line yield for HBT wafers.

SUMMARY

According to one embodiment disclosed herein, a method for fabricating an HBT comprises providing a structure comprising sequentially a substrate, a collector layer for the HBT, a base layer for the HBT, an epitaxial layer, and an emitter metal layer for the HBT; etching the emitter metal layer and the epitaxial layer to form an emitter electrode comprised of an epitaxy pedestal underlying an emitter metal cap and having horizontal dimensions that are substantially equal to the emitter metal cap; depositing a photoresist layer over the structure; irradiating the photoresist layer through a mask; removing a portion of the photoresist layer to expose a portion of the base layer that is spaced a predetermined distance away from the emitter electrode; depositing base metal over the structure; and removing the remainder of the photoresist layer together with the base metal deposited thereupon.

According to another embodiment disclosed herein, a method for fabricating an HBT comprises providing a structure comprising sequentially a substrate, a collector layer for the HBT, a base layer for the HBT, an epitaxial layer, and an emitter metal layer for the HBT; etching the emitter metal layer and the epitaxial layer to form an emitter electrode comprised of an epitaxy pedestal underlying an emitter metal cap and having horizontal dimensions that are substantially equal to the emitter metal cap; depositing a base metal layer over the structure; depositing a photoresist layer over the base metal layer; irradiating the photoresist layer through a mask; removing a portion of the photoresist layer so that only a portion of the base metal layer that is spaced a predetermined distance away from the emitter electrode remains covered by photoresist; removing the portion of the base metal layer that is not covered by photoresist; and removing the remainder of the photoresist.

The photoresist that is irradiated may be subsequently removed to expose the base layer, or alternatively the photoresist that is shielded by the mask from being irradiated is subsequently removed to expose the base layer.

DETAILED DESCRIPTION

Figure 1:
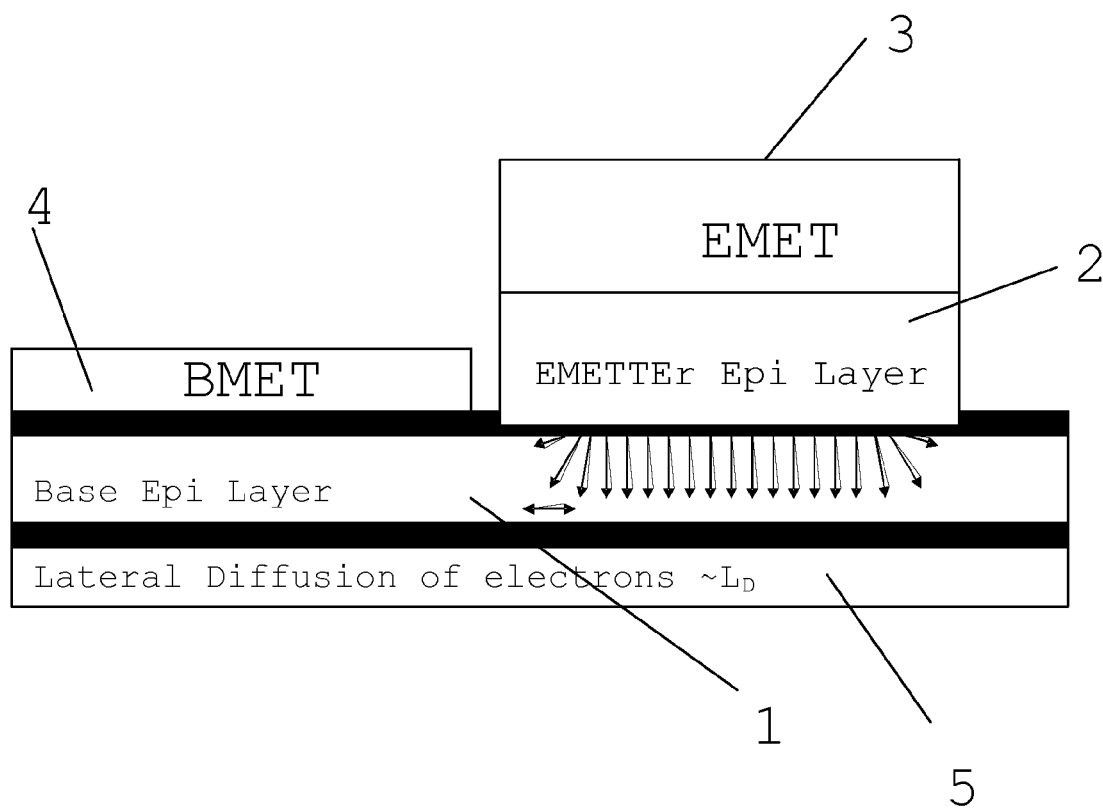
FIG. 1 is a cross sectional view of an HBT according to the prior art, depicting the recombination mechanism that leads to reductions and variation in device Beta.

The base metal 4 is placed according to the present disclosure at least some multiple of a diffusion length ($L_D$) away from the emitter 2 in order to avoid reduction and variation in device Beta. This is accomplished in self-aligned (SA) HBTs by a method of wet etching of the emitter pedestal (emitter metal cap 3 and emitter epitaxy 2) to move the emitter epitaxial layer further under the EMET pattern 4. The present disclosure provides a method of lithography to control this emitter-to-base spacing and to minimize the diffusion of electrons.

Figure 2:
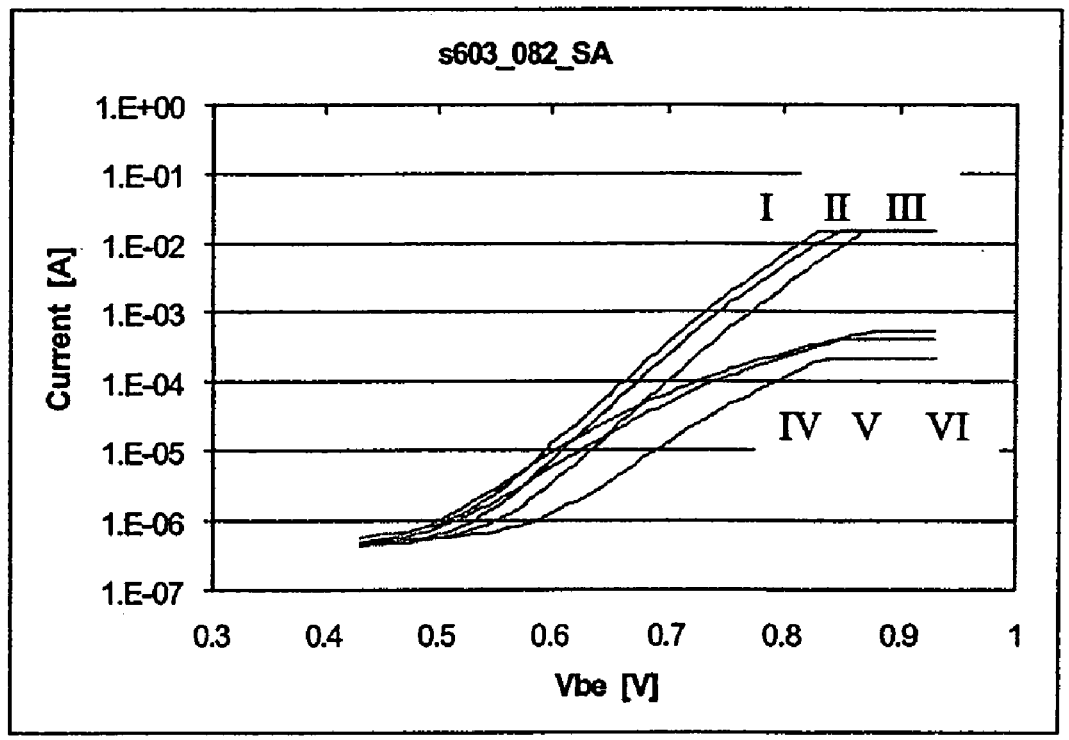
FIG. 2 depicts the measured 2-terminal forward Gummel data for three self-aligned devices (SA InP HBTs) measured on the same wafer (current [A] versus Vbe [V]).

Two-terminal forward Gummel characteristics for three self-aligned HBT devices were measured at three different sites across a three-inch InP wafer as shown in FIG. 2. The top three curves (I, II, III) plot the collector current and show the variation in device turn-on voltage across the wafer. The bottom three curves (IV, V, VI) are the measured base current of the devices, which shows the large variation in leakage current across the wafer for these self-aligned devices.

Figure 3:
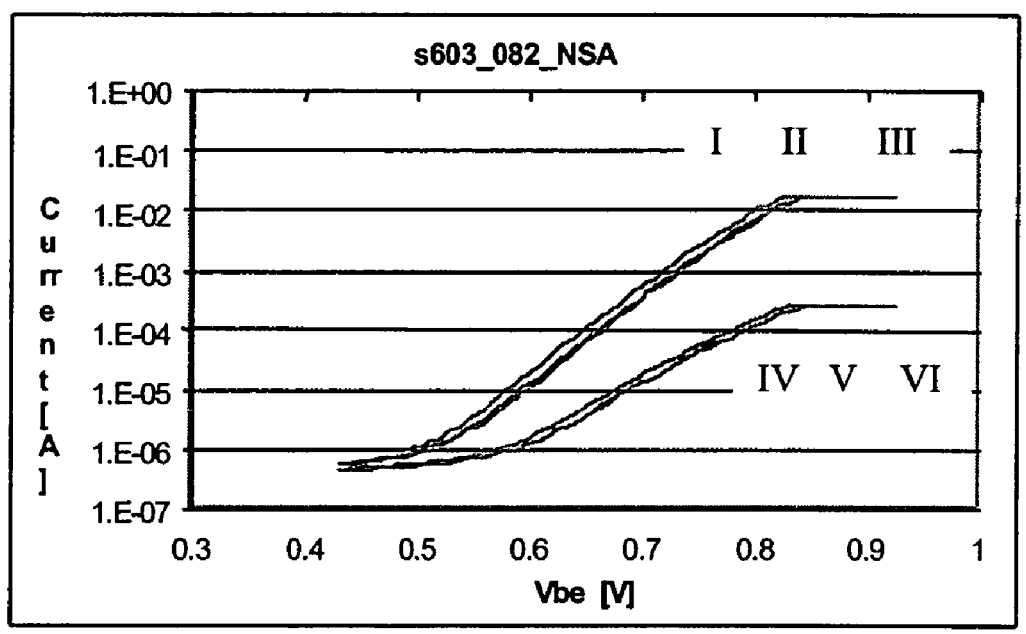
FIG. 3 depicts the measured 2-terminal forward Gummel data for three non-self-aligned devices (NSA InP HBTs) on the same wafer and fields (current [A] versus Vbe [V]).

Two-terminal forward Gummel characteristics for three non-self-aligned (NSA) HBT devices were measured at three different sites across a three-inch InP wafer as shown in FIG. 3. The device measurements plotted here were taken from devices adjacent to the three from FIG. 2. The top three curves (I, II, III) plot the collector current and show that these devices demonstrate a great improvement in minimizing the variation in device turn-on voltage across the wafer. The bottom three curves (IV, V, VI) are the measured base current of the devices which shows significantly lower leakage current as well as reduced variation across the wafer for these non-self-aligned devices. The reduced leakage current demonstrated by these NSA devices leads to higher gain and usable gain at extremely low power levels.

Figure 4:
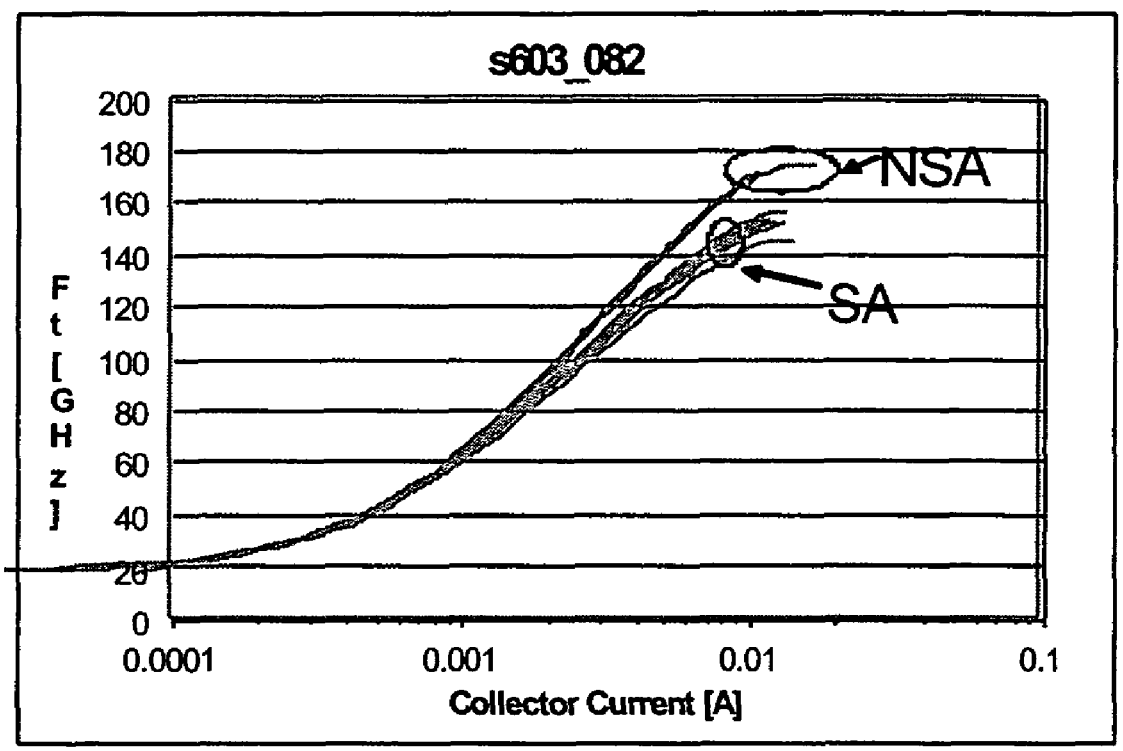
FIG. 4 depicts measurements of the frequency performance of six self-aligned and non-self-aligned InP HBTs devices from the same wafer and fields ($F_t$ [GHz] versus $I_c$ [A]) for several devices as shown in FIG. 2 and FIG. 3.
Figure 5:
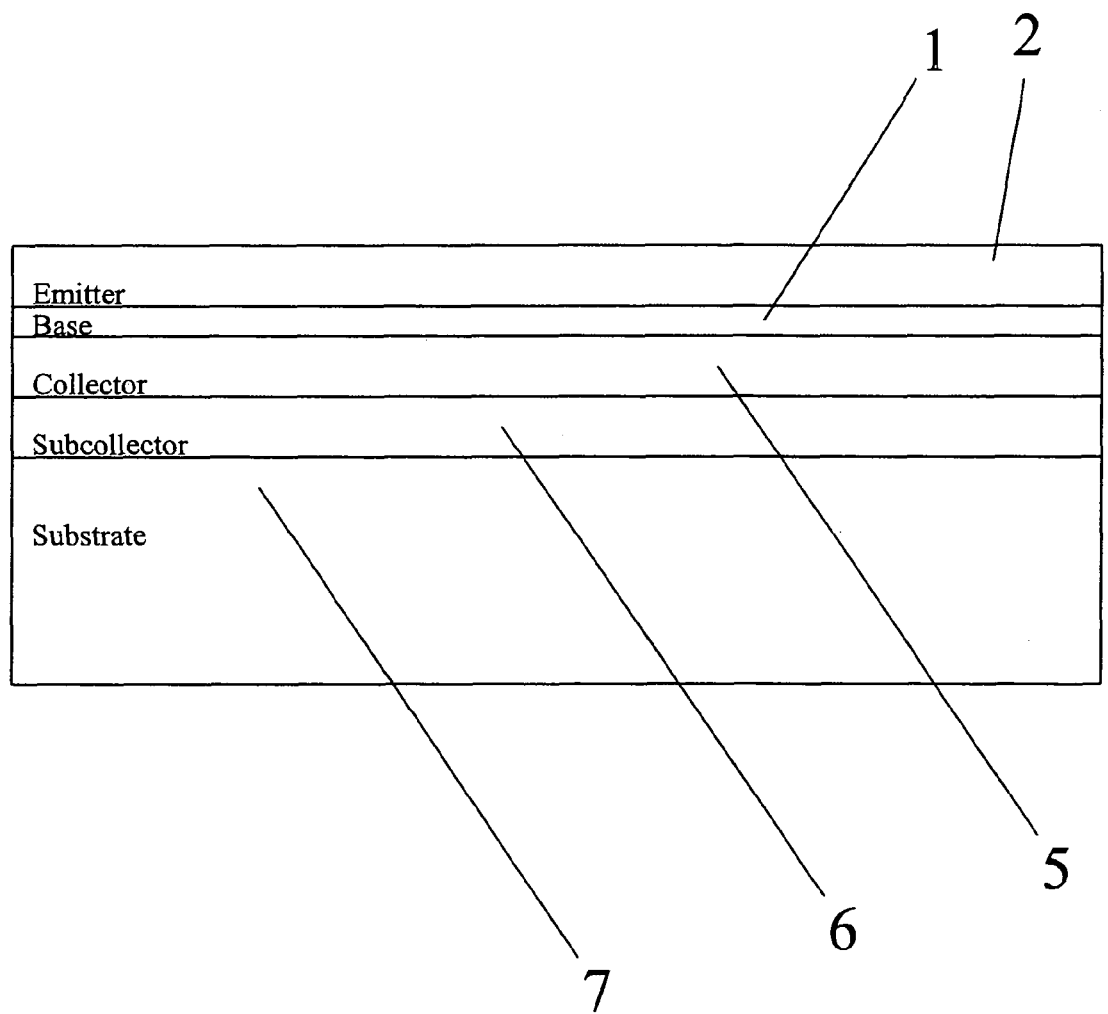
FIG. 5 depicts a cross-sectional view of the starting epitaxial layer structure for an HBT as known in the art.

The unity gain cutoff frequency ($F_t$) for the six devices from FIG. 2 and FIG. 3 were measured and are shown in FIG. 4. Extrapolation of ft was done from a single frequency point s-parameter measurement assuming an h21 versus frequency slope of –20 dB/decade. This plot shows that the NSA devices operated at higher frequencies, compared to the self-aligned devices, across the entire range of current or power levels.

Figure 6:
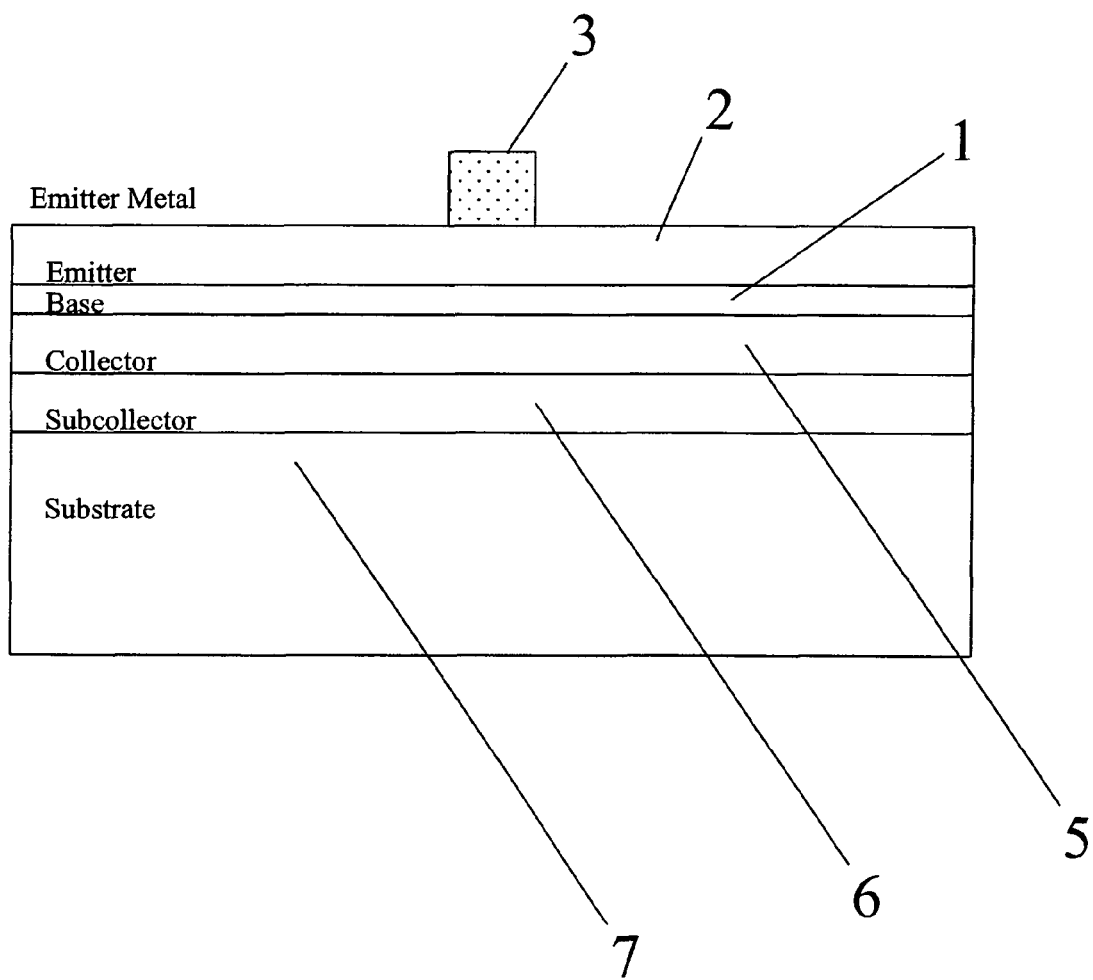
FIG. 6 depicts a cross-sectional view of the layer structure of FIG. 5 after depositing and patterning the emitter metal.

With reference now to FIG. 6, the starting material is preferably a layer structure, which comprises a base 1. An emitter epitaxial layer 2 is deposited or grown on the base 1. An emitter metal layer (EMET) 3 is deposited on the emitter epitaxial layer 2. Underneath the base layer 1 a collector layer 5 and below the collector layer 5 a subcollector layer 6 is deposited on the substrate 7. The described layer structure beginning with substrate 7, and on the substrate preferably the following layers are deposited: subcollector 6, collector 5, base layer 1, emitter epitaxial layer 2 and emitter metal layer 3 is a preferred starting material for manufacturing SA and NSA transistors. This structure is referred to as the HBT epitaxial layer structure.

Figure 7:
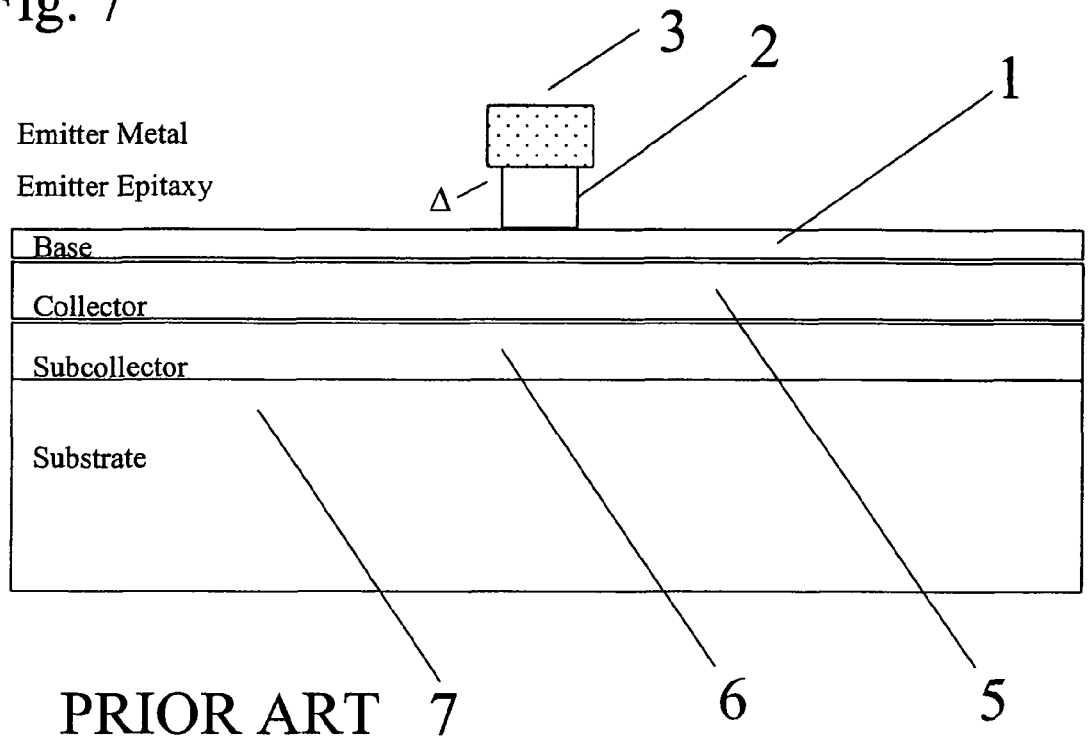
FIG. 7 depicts a cross-sectional view of the layer structure of FIG. 6 after removing the emitter epitaxial layer under the emitter metal, and showing an undercut Δ of the emitter epitaxy according to the prior art.
Figure 7A:
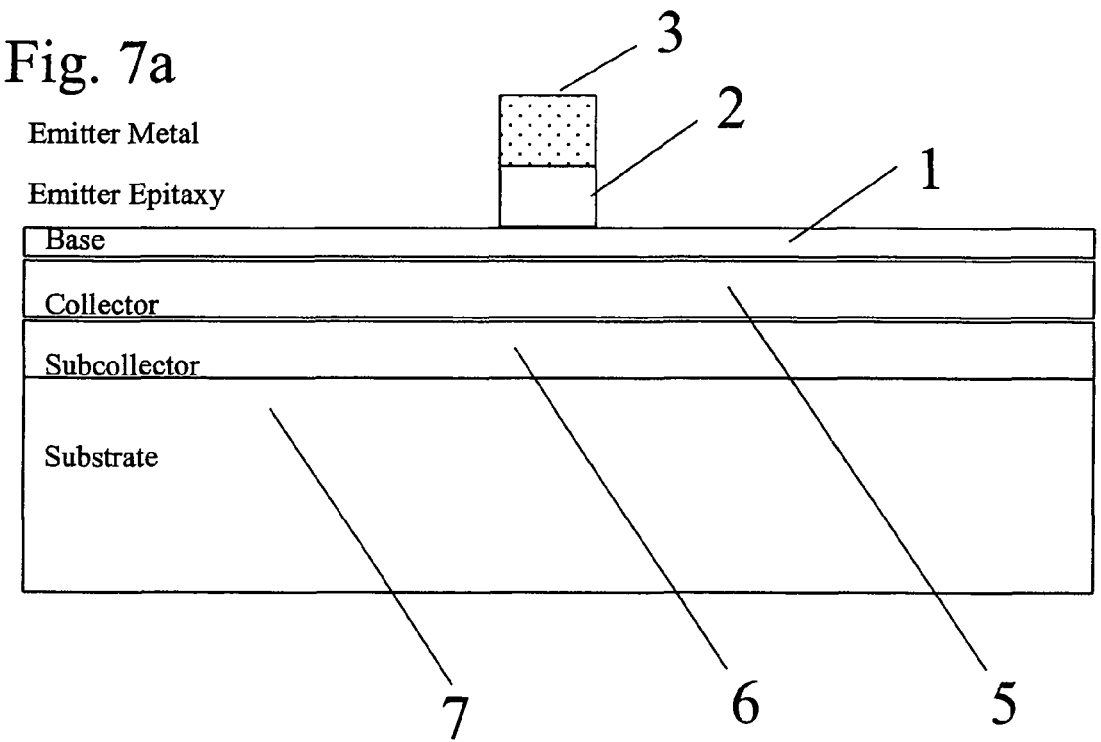
FIG. 7a depicts a cross-sectional view of the layer structure after removing the emitter epitaxial layer under the emitter metal but without the undercut Δ of FIG. 7.
Figure 16:
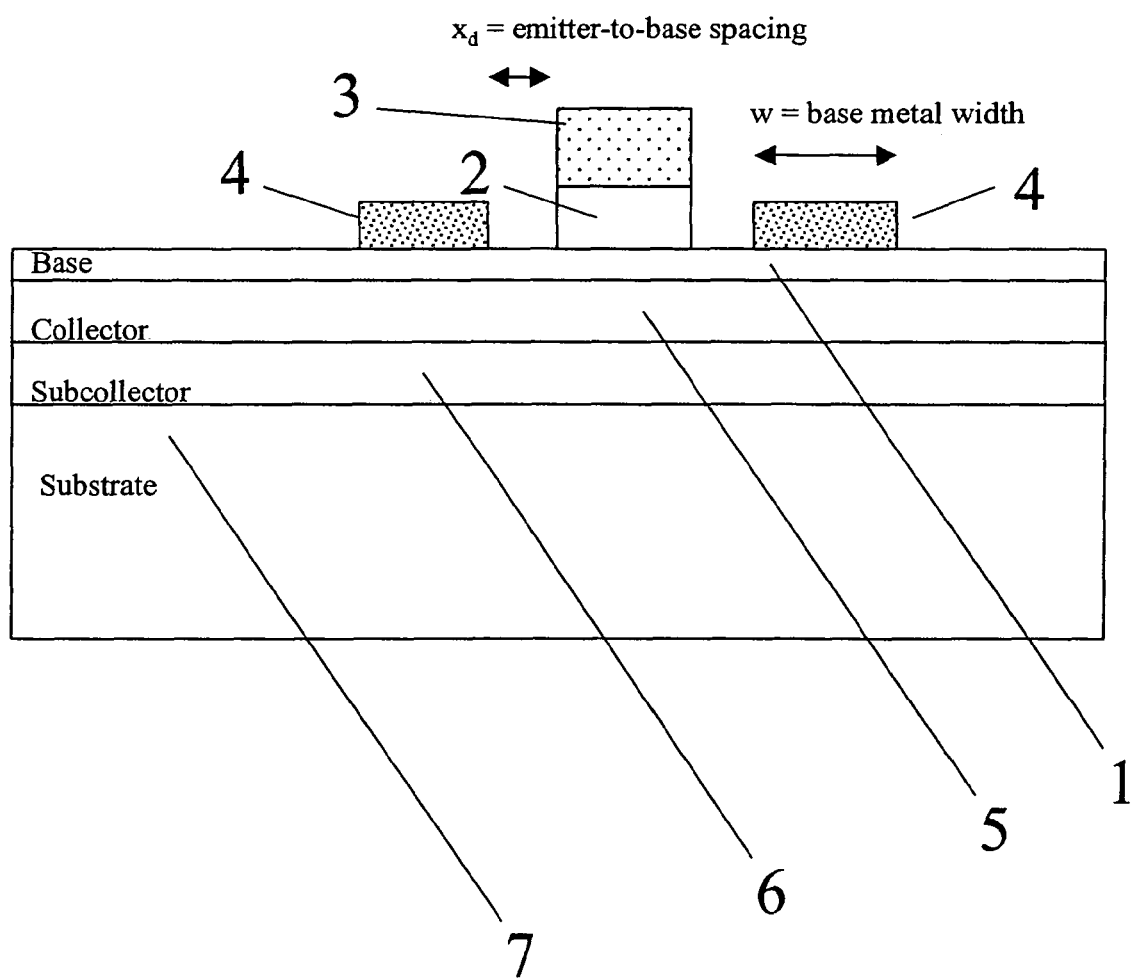
FIG. 16 depicts a cross-sectional view of the layer structure of FIG. 15, and corresponding to line 16-16 of the non-self-aligned HBT of FIG. 23, after removing the remaining photoresist and base metal on top of the remaining photoresist, according to the present disclosure.
Figure 22:
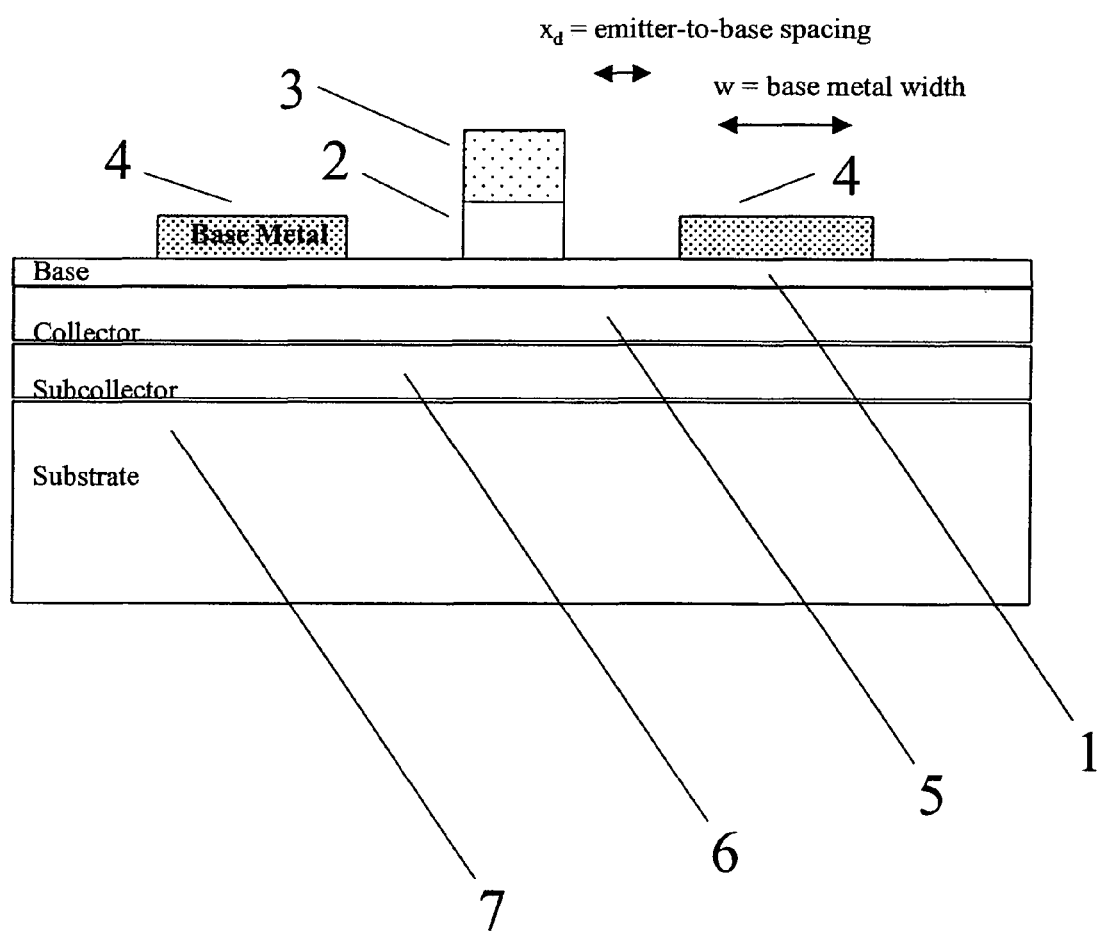
FIG. 22 depicts a cross-sectional view of the layer structure of FIG. 21, and corresponding to line 23-23 of the non-self-aligned HBT of FIG. 23, after removing the remaining photoresist, according to the present disclosure.
Figure 23:
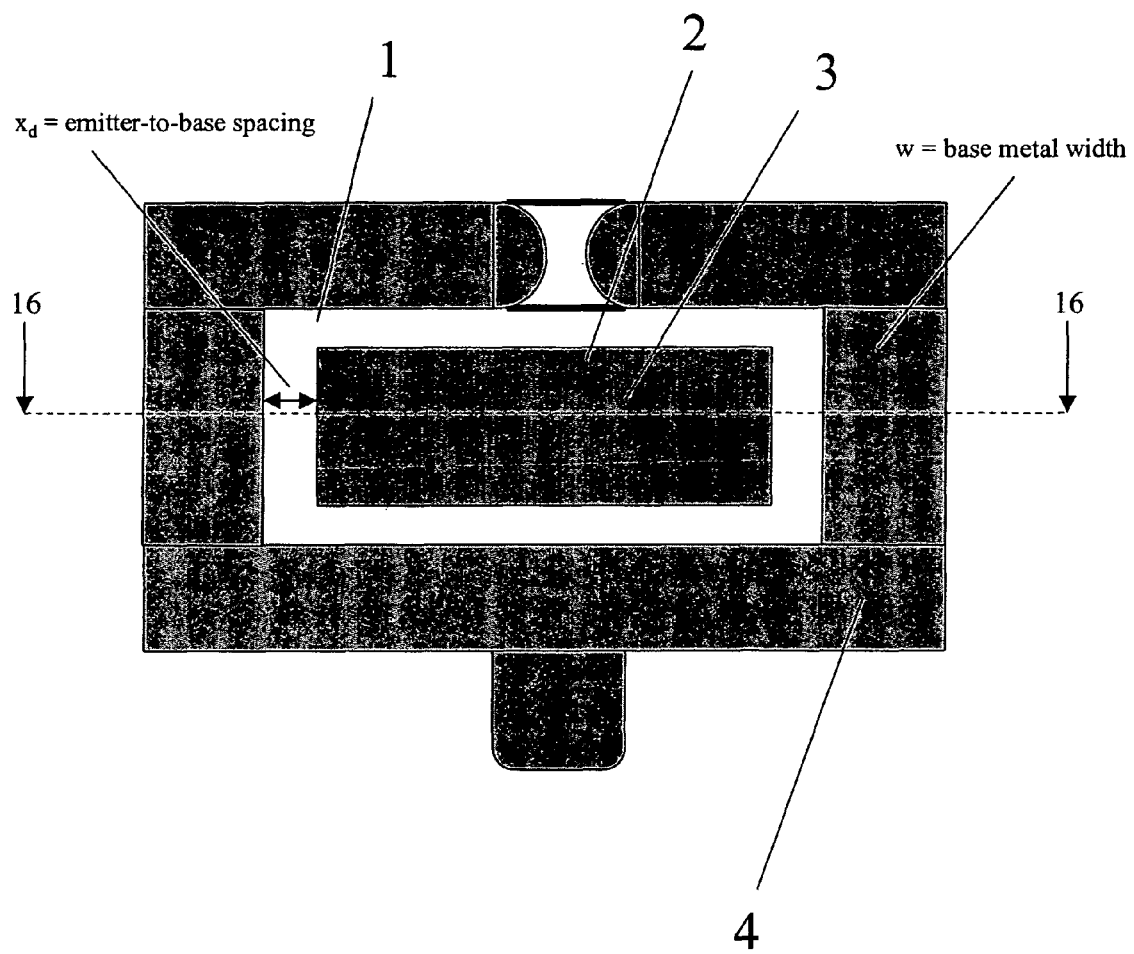
FIG. 23 depicts a top view of the emitter and base mask layers of a generic non-self-aligned HBT according to the present disclosure.
Figure 24:
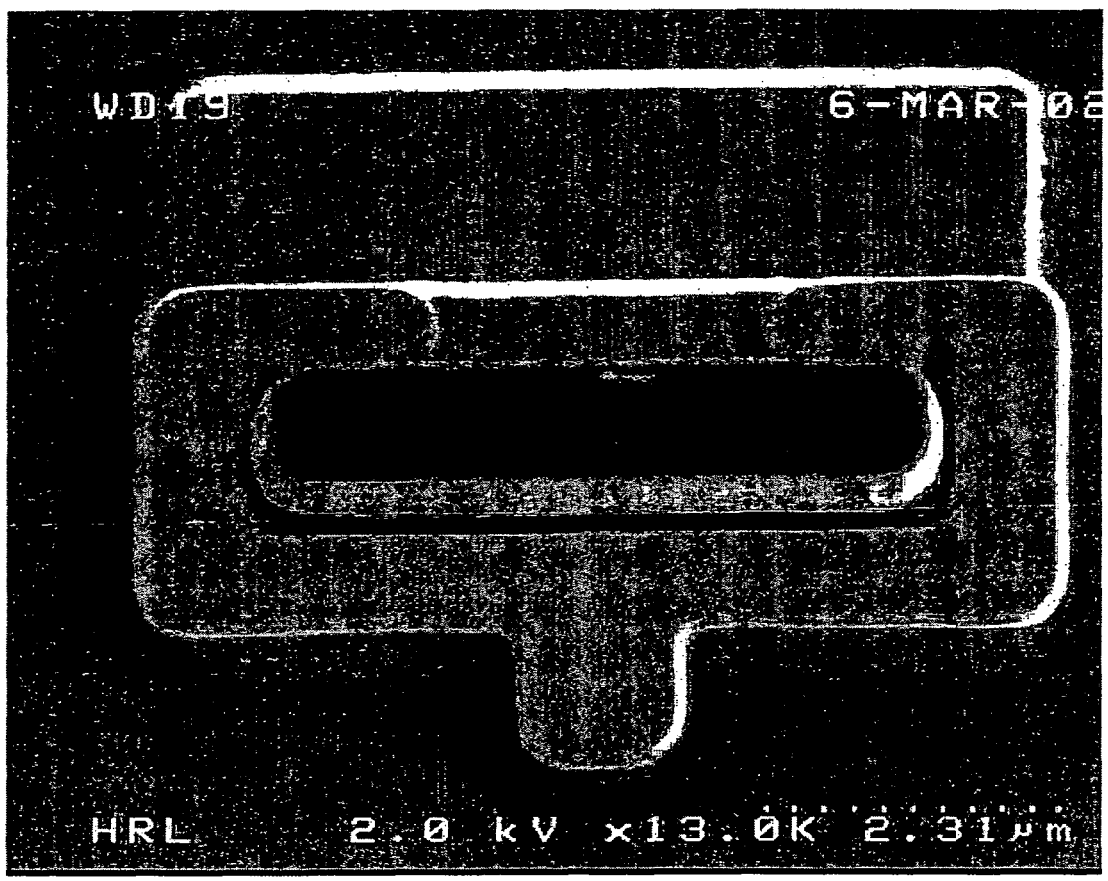
FIG. 24 is a Scanning electron micrograph of the NSA HBT depicted in FIG. 23.

According to one embodiment disclosed herein, the layer structure as shown in FIG. 7a is used as the starting structure. The emitter epitaxy 2 of this starting structure does not have an undercut Δ. The process for yielding the emitter epitaxy 2 involves only dry etching, and the step of wet etching is omitted. It is the wet etch process that creates the undercut Δ of the emitter epitaxy 2 and which is necessary to the prior art devices to avoid shorting between the base metal 4 and the emitter epitaxy 2. The process of the present disclosure makes it possible to deposit the base metal 4 on the base 1 at a controlled distance from the emitter epitaxy 2 to thereby avoid shorting, as best shown in FIGS. 16 and 22.

Figure 8:
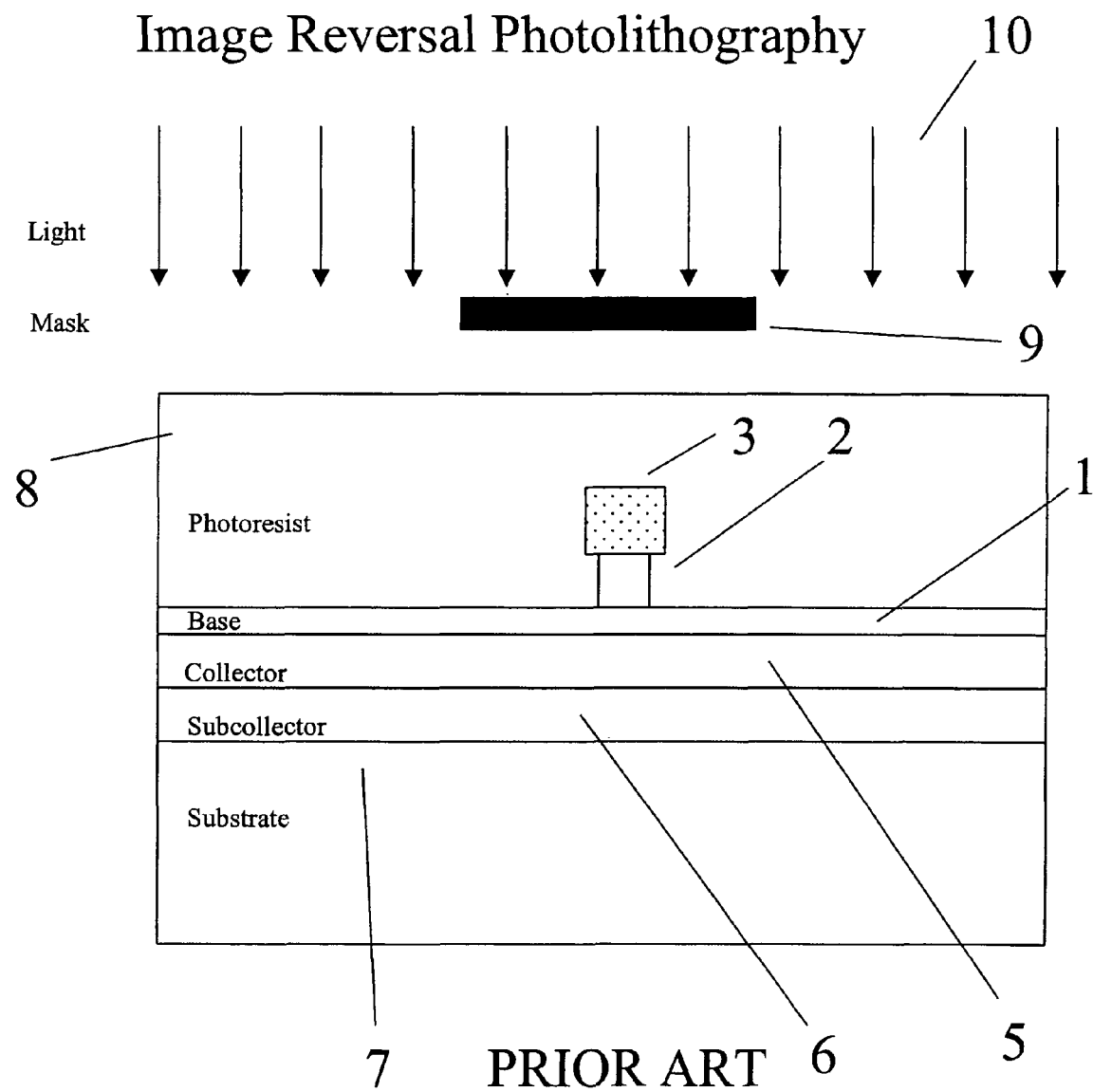
FIG. 8 depicts a cross-sectional view of the layer structure of FIG. 7 after applying a photoresist layer on the layer structure and irradiating the photoresist layer through a mask designed for the process of image reversal photolithography according to the prior art.
Figure 9:
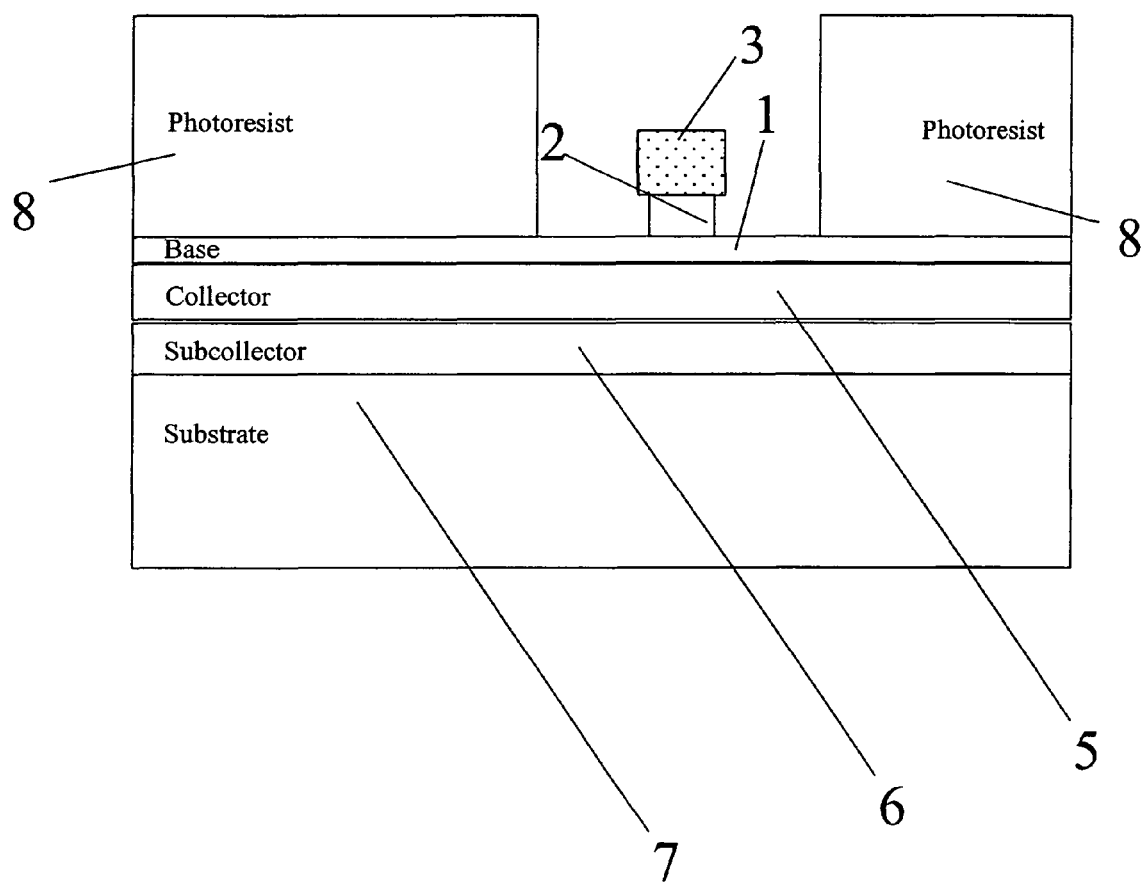
FIG. 9 depicts a cross-sectional view of the layer structure of FIG. 8 after removing the photoresist layer in the desired areas according to the prior art.
Figure 10:
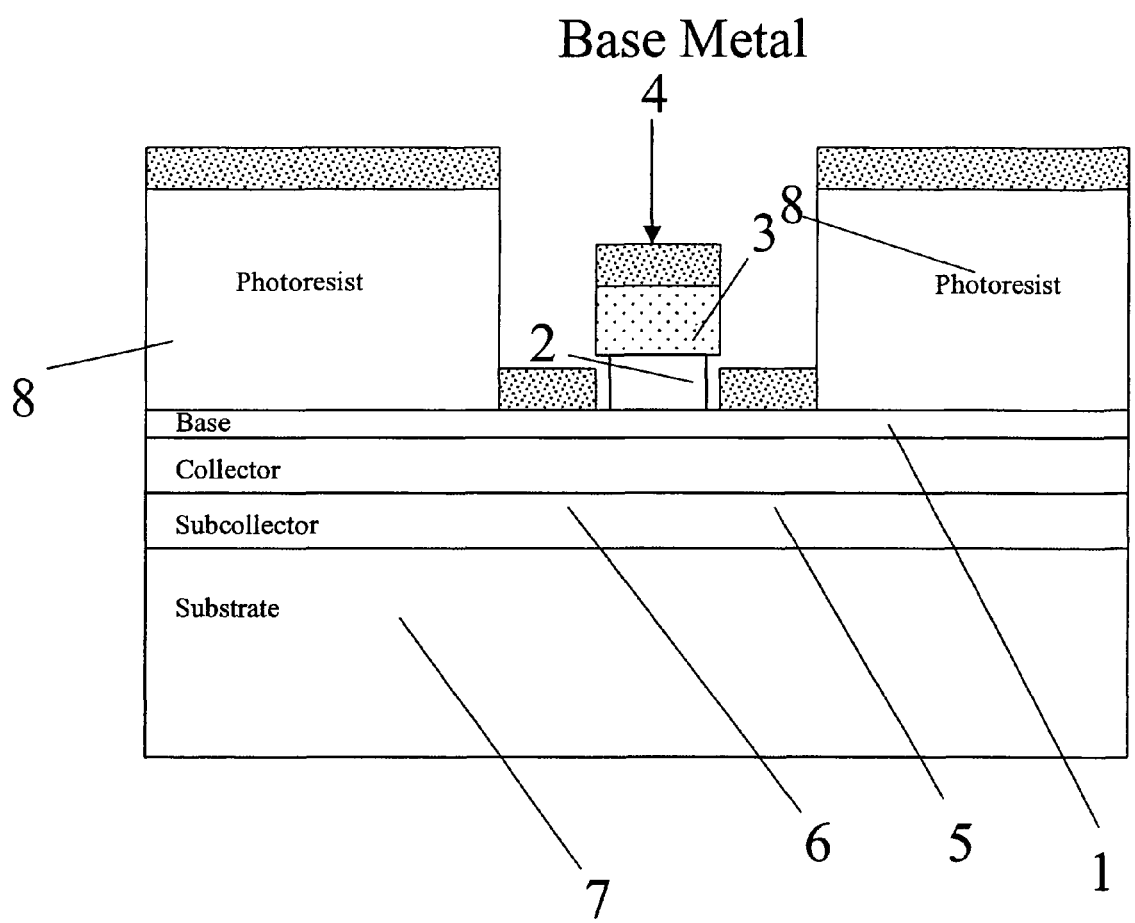
FIG. 10 depicts a cross-sectional view of the layer structure of FIG. 9 after base metal deposition on the wafer according to the prior art.
Figure 12:
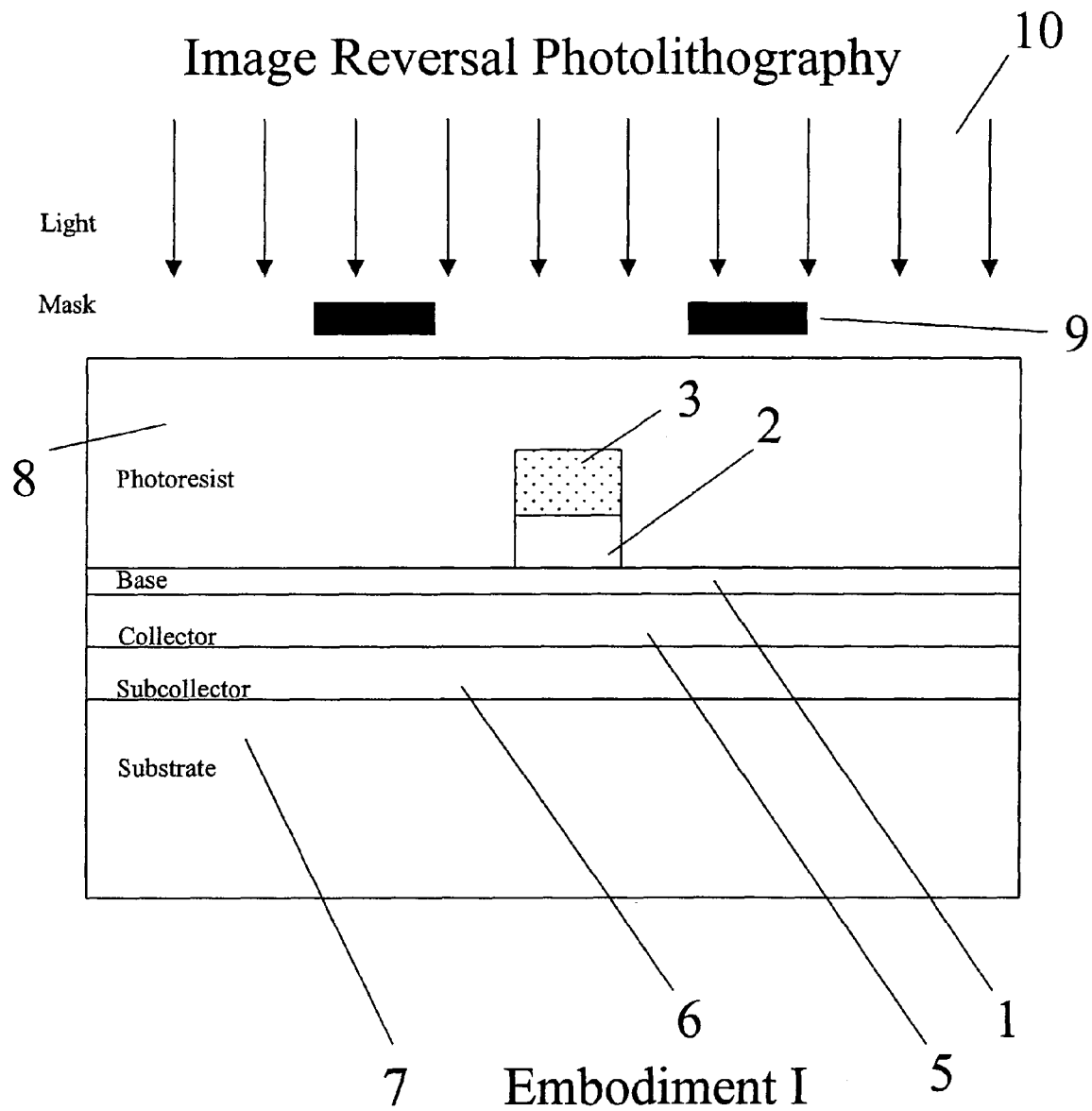
FIG. 12 depicts a cross-sectional view of the layer structure of FIG. 7a after applying a photoresist layer and irradiating the photoresist layer through a mask designed for the process of image reversal photolithography, according to the present disclosure.

A photoresist layer 8 is applied on the top surface layer. Two different methods can be preferably applied to irradiate and remove photoresist layer 8, image reversal photography and positive photolithography. Image reversal photography is shown in FIG. 12 and previously explained in regard to FIG. 8. The photoresist layer 8 is irradiated by light 10 through a mask 9. The mask 9 leaves the area of photoresist 8 covering the emitter epitaxy 2 and the emitter metal cap 3 together with what is later to become the emitter-to-base spacing $x_D$ away from the emitter, exposed to be irradiated. After irradiation the surface of the photoresist layer 8 that was irradiated through the mask 9 becomes impervious to removal, while the area of the photoresist 8 that was covered and therefore not irradiated is susceptible to removal and can be removed.

Figure 13:
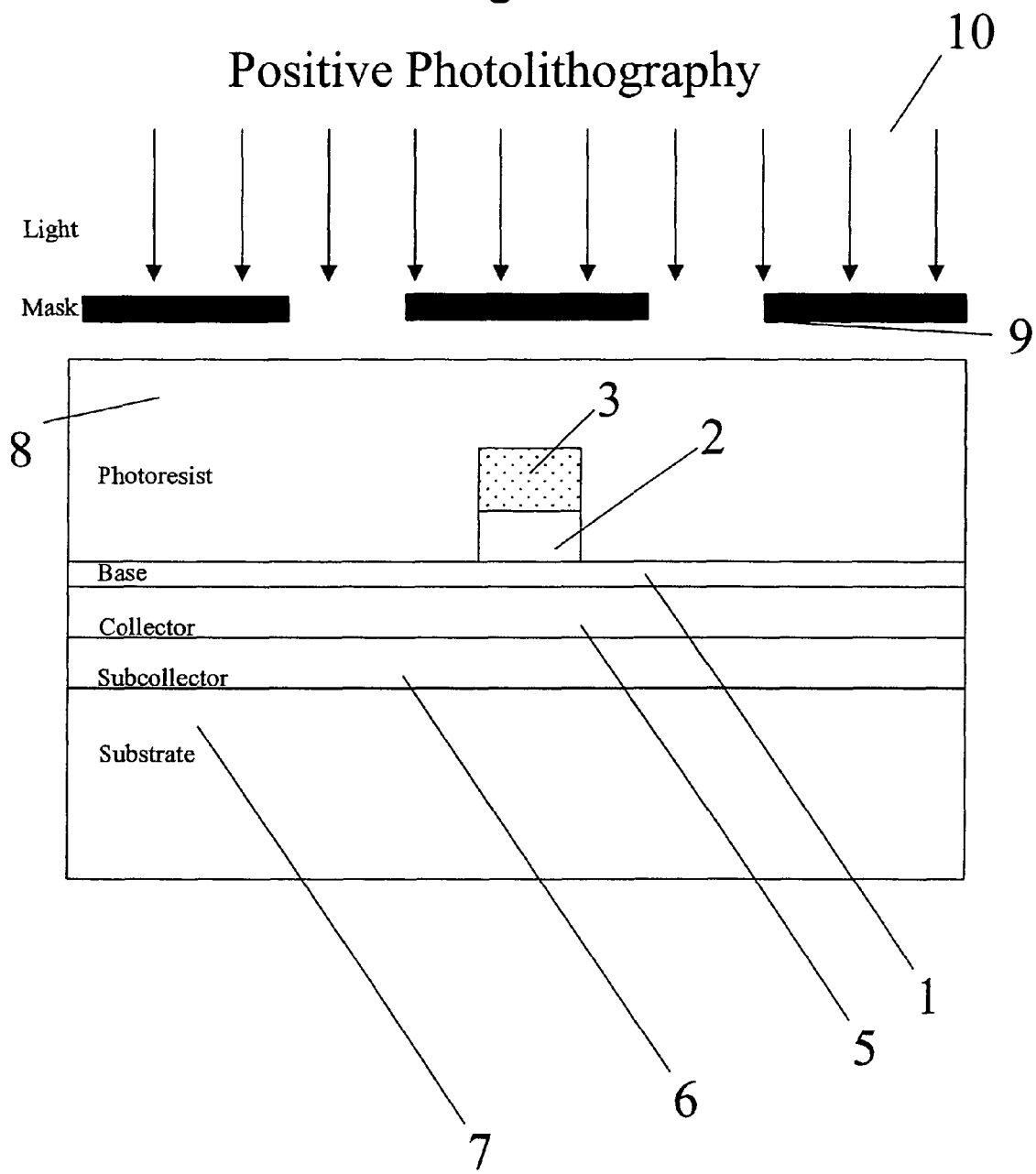
FIG. 13 depicts a cross-sectional view of the layer structure of FIG. 7a after applying a photoresist layer and irradiating the photoresist layer through a mask designed for the process of positive photolithography, according to the present disclosure.

In the positive photolithography method as shown in FIG. 13, the photoresist layer 8 is irradiated by light 10 through a mask 9 that covers the area of the emitter and the emitter-to-base spacing $x_D$ away from the emitter. After irradiation, the surface of the photoresist layer 8 that was irradiated through the mask 9 becomes susceptible to removal while the area of the photoresist 8 that was covered and therefore not irradiated remains impervious and cannot be removed.

In both methods, the mask 9 must be carefully designed so that after removing the non-irradiated photoresist 8 in the image reversal photography and after removing the irradiated photoresist 8 in the positive photolithography, parts of the base layer 1 are still covered by photoresist layer 8. Both methods, image reversal photolithography and positive photolithography, yield the structure shown in FIG. 14. The two methods use a positive or negative mask and require different photoresist material. Both methods are well known in the art, and are described in Microlithography, Micromachining, and Microfabrication, Vol. 1: Microlithography, Editor P. Rai-Choudhury, 1997 SPIE Optical Engineering Press, Bellingham, Wash. and Semiconductor Lithography Principles, Practices, and Materials, Wayne M. Moreau, 1988 Plenum Press, New York, which are both incorporated herein by reference.

Figure 14:
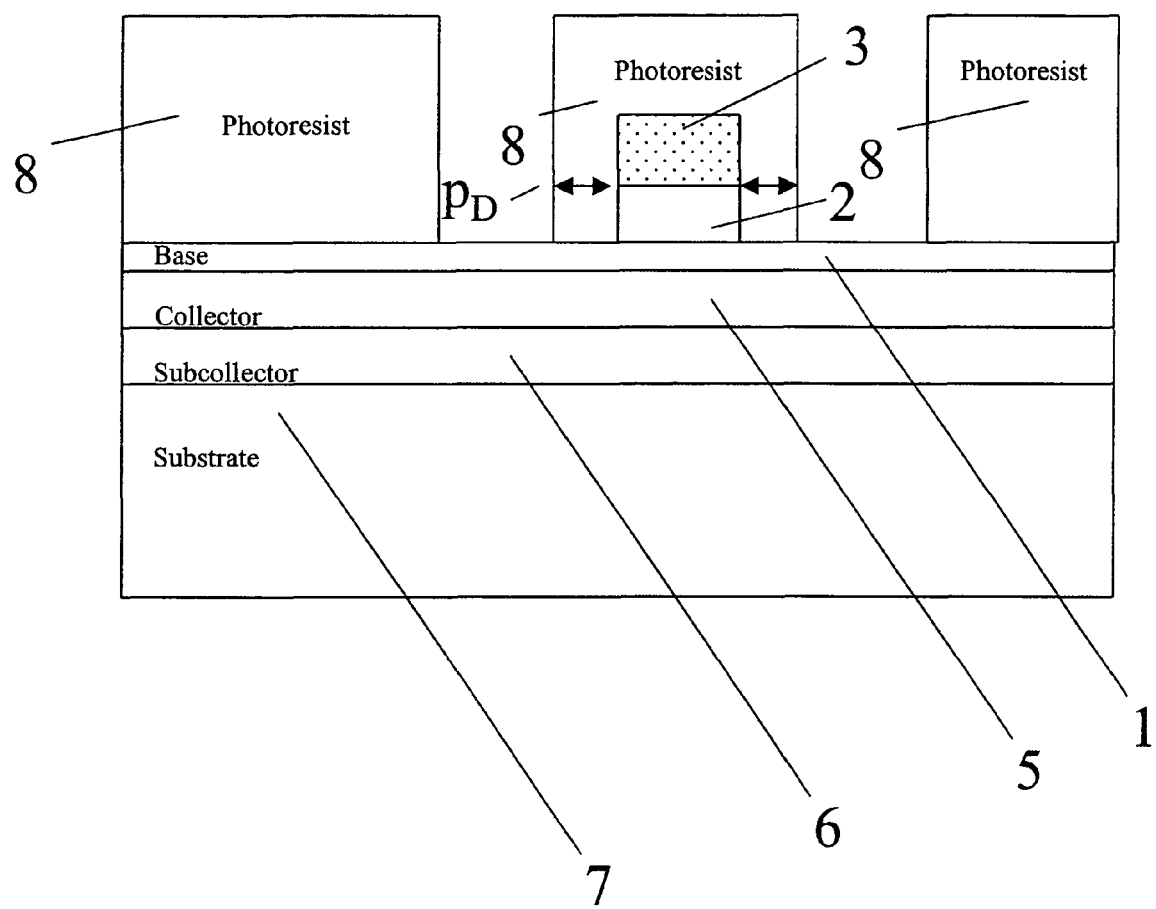
FIG. 14 depicts a cross-sectional view of the layer structure of FIG. 12 after removing the non-irradiated photoresist after the process of image reversal photolithography or the layer structure of FIG. 13 after removing of irradiated photoresist layer in the process of positive photolithography, according to the present disclosure.
Figure 15:
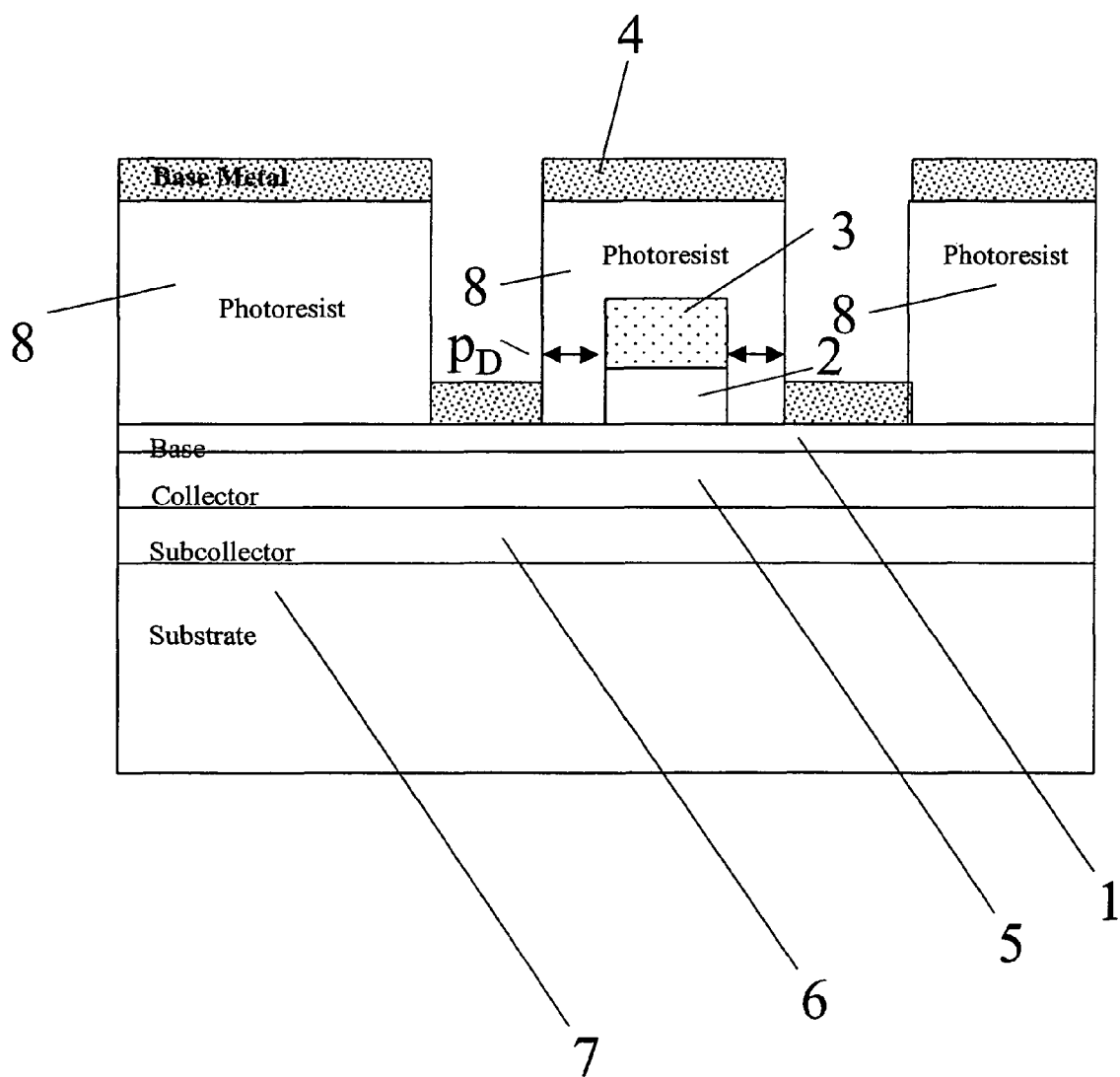
FIG. 15 depicts a cross-sectional view of the layer structure of FIG. 14 after base metal deposition on the wafer.

It is important that the emitter electrode, that is, the emitter epitaxy 2 and the emitter metal cap 3 are not exposed, but rather are both vertically and horizontally covered by the photoresist layer 8, as shown in FIG. 14. The width $p_D$ of the vertical coverage of the emitter metal cap 3 with photoresist 8 predetermines the later emitter-to-base spacing $x_D$. The thickness of the vertical coverage of the emitter metal cap 3 predetermines the emitter-to-base spacing $x_D$ as shown in FIG. 16. In the next step the entire top surface is covered with base metal 4, as shown in FIG. 15. In the following step the photoresist 8 is removed together with any base metal 4 on top of the photoresist 8, as shown in FIG. 16.

Figure 11:
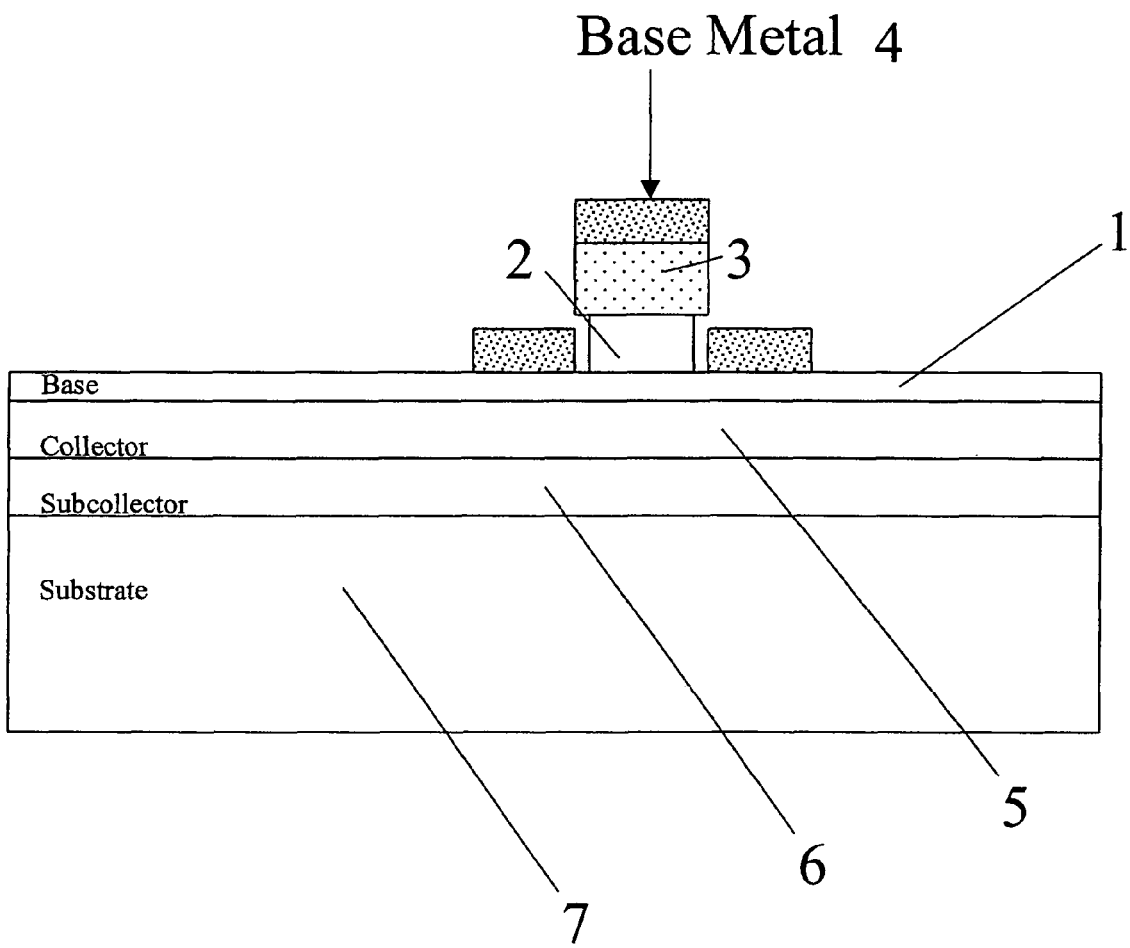
FIG. 11 depicts a cross-sectional view of the layer structure of FIG. 10 after removing the photoresist layer and base metal layer on top of the photoresist layer according to the prior art.

A comparison between the SA design of the state of the art in FIG. 11 and the NSA design obtained by the method outlined in FIGS. 12-16 shows that an emitter-to-base spacing $x_d$ is created by the method according to the present disclosure. Furthermore, the emitter electrode obtained by the methods of the present disclosure is not covered by base metal 4.

Figure 17:
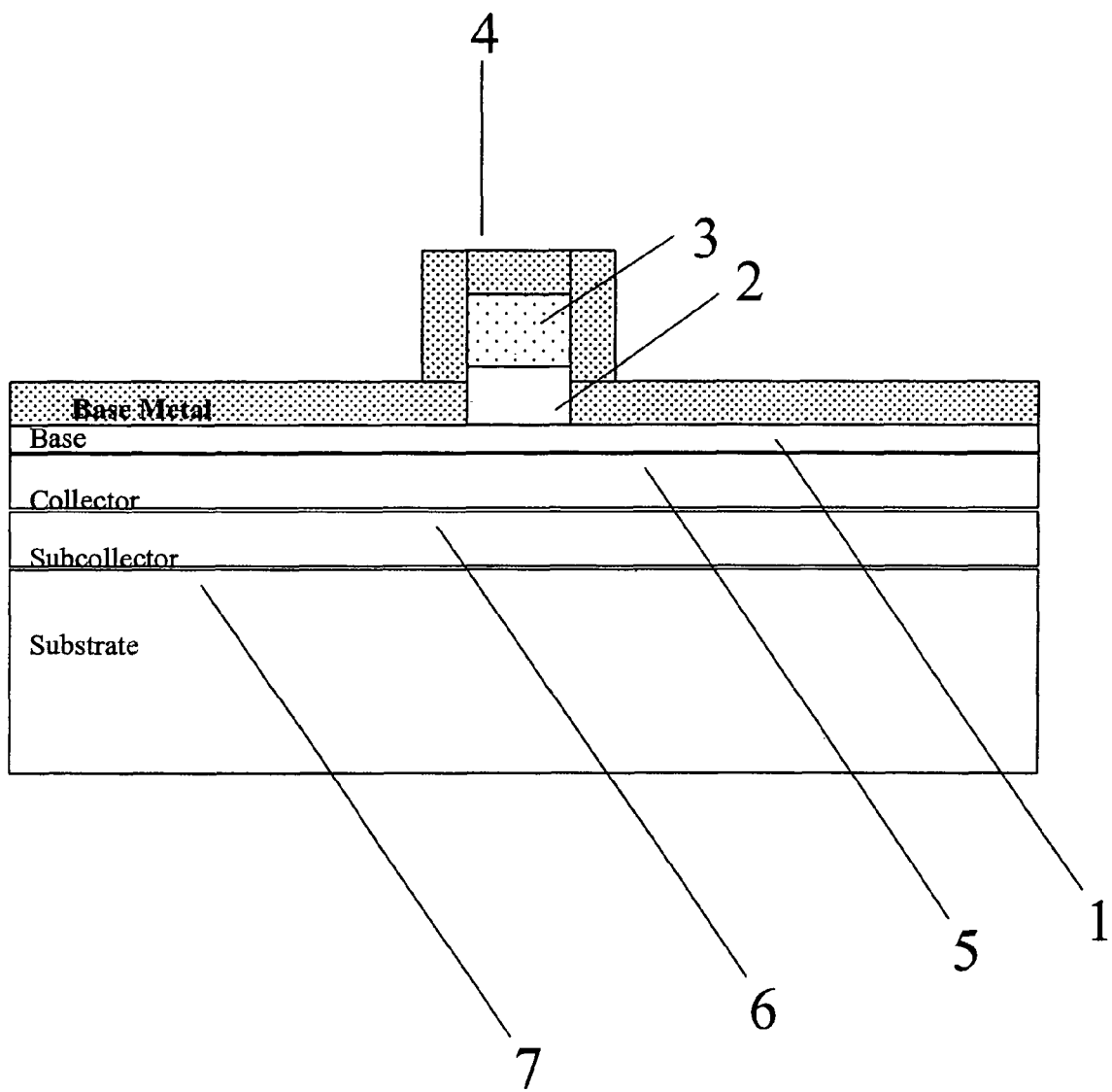
FIG. 17 depicts a cross-sectional view of the layer structure of FIG. 7a after applying a base metal layer according to a second embodiment of the present disclosure.
Figure 18:
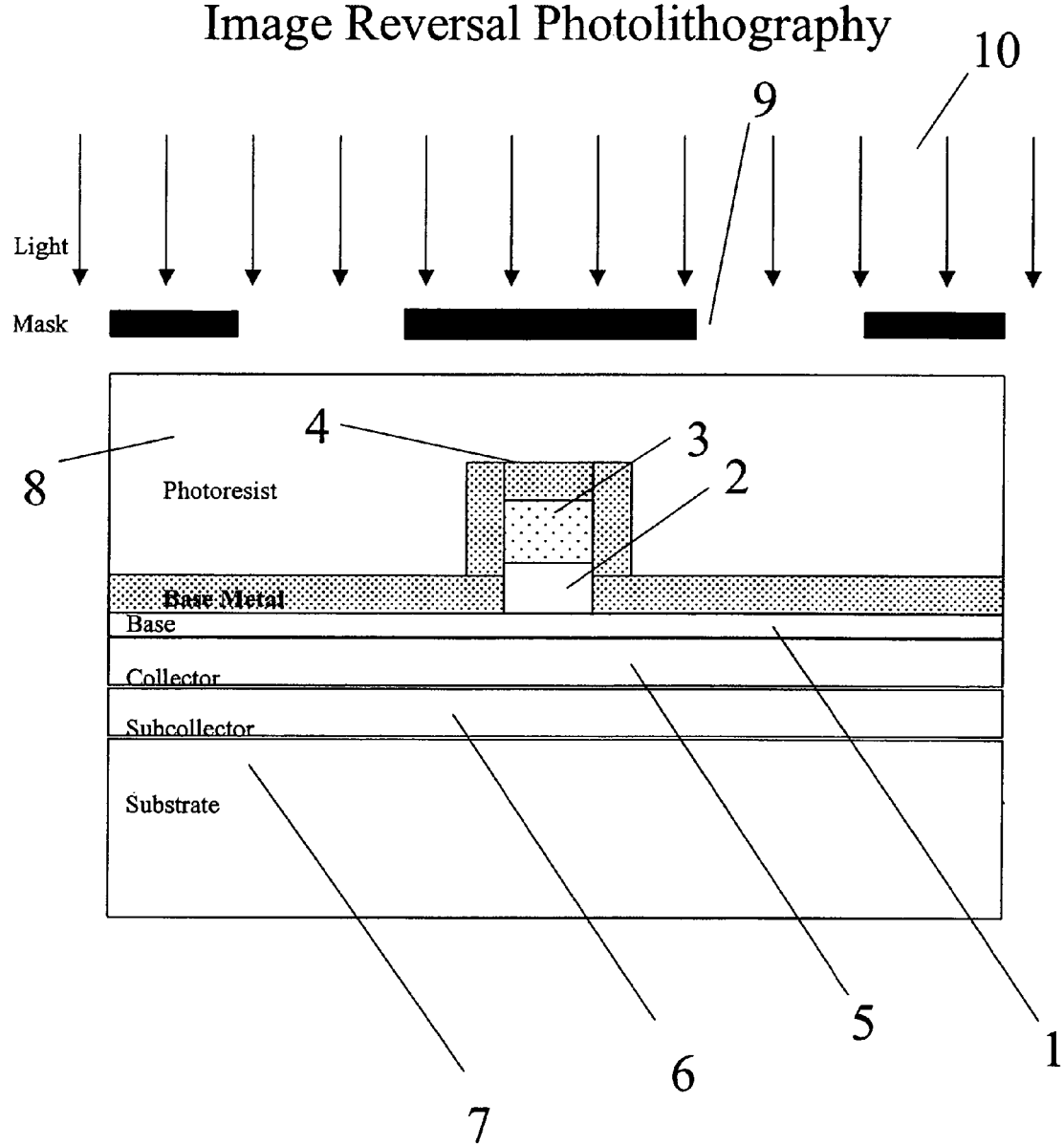
FIG. 18 depicts a cross-sectional view of the layer structure of FIG. 17 after applying a photoresist layer on the base metal layer and irradiating the photoresist layer through a mask designed for image reversal photolithography, according to the present disclosure.
Figure 19:
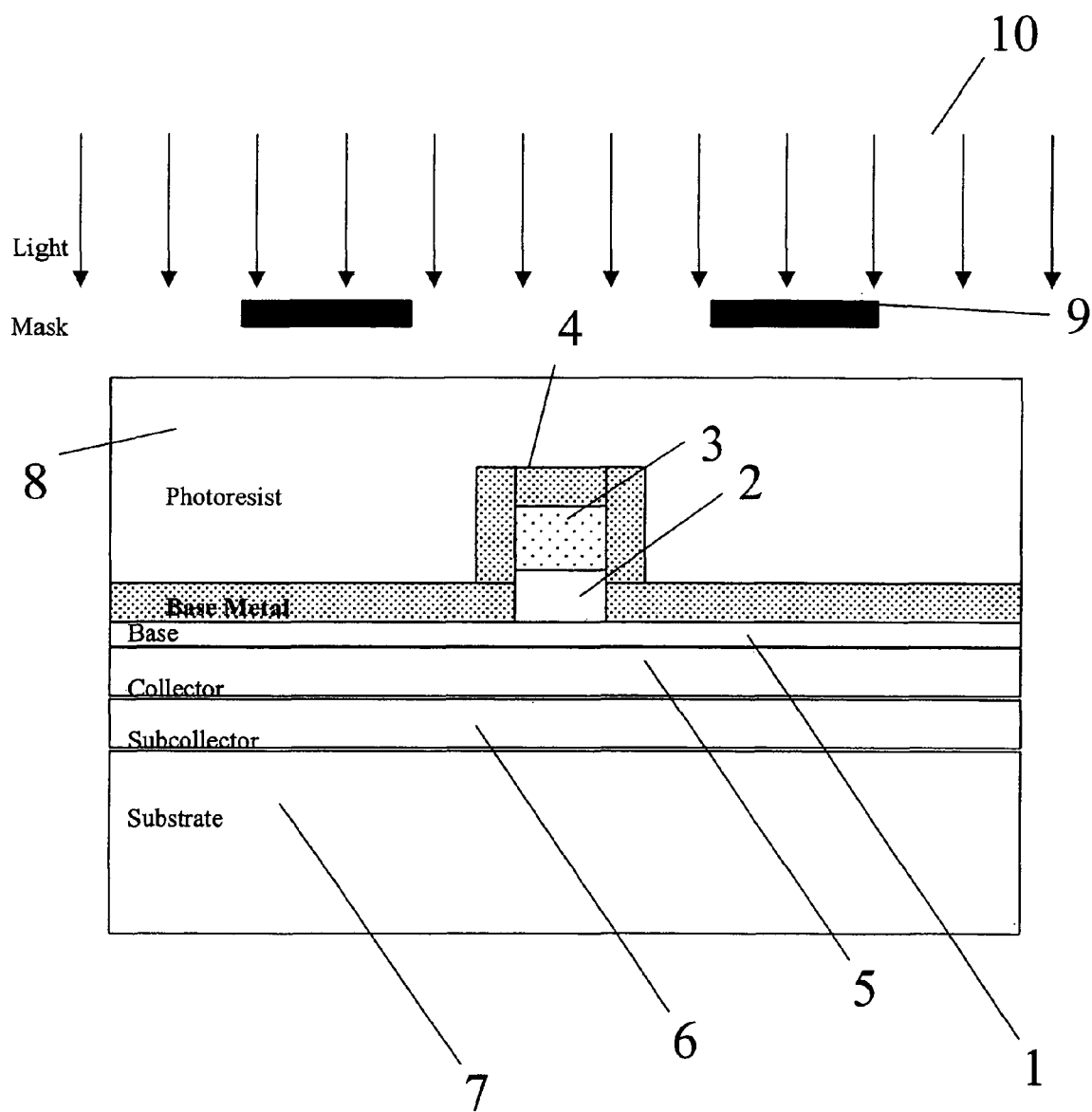
FIG. 19 depicts a cross-sectional view of the layer structure of FIG. 17 after applying a photoresist layer on the base metal layer and irradiating the photoresist layer through a mask designed for positive photolithography, according to the present disclosure.
Figure 20:
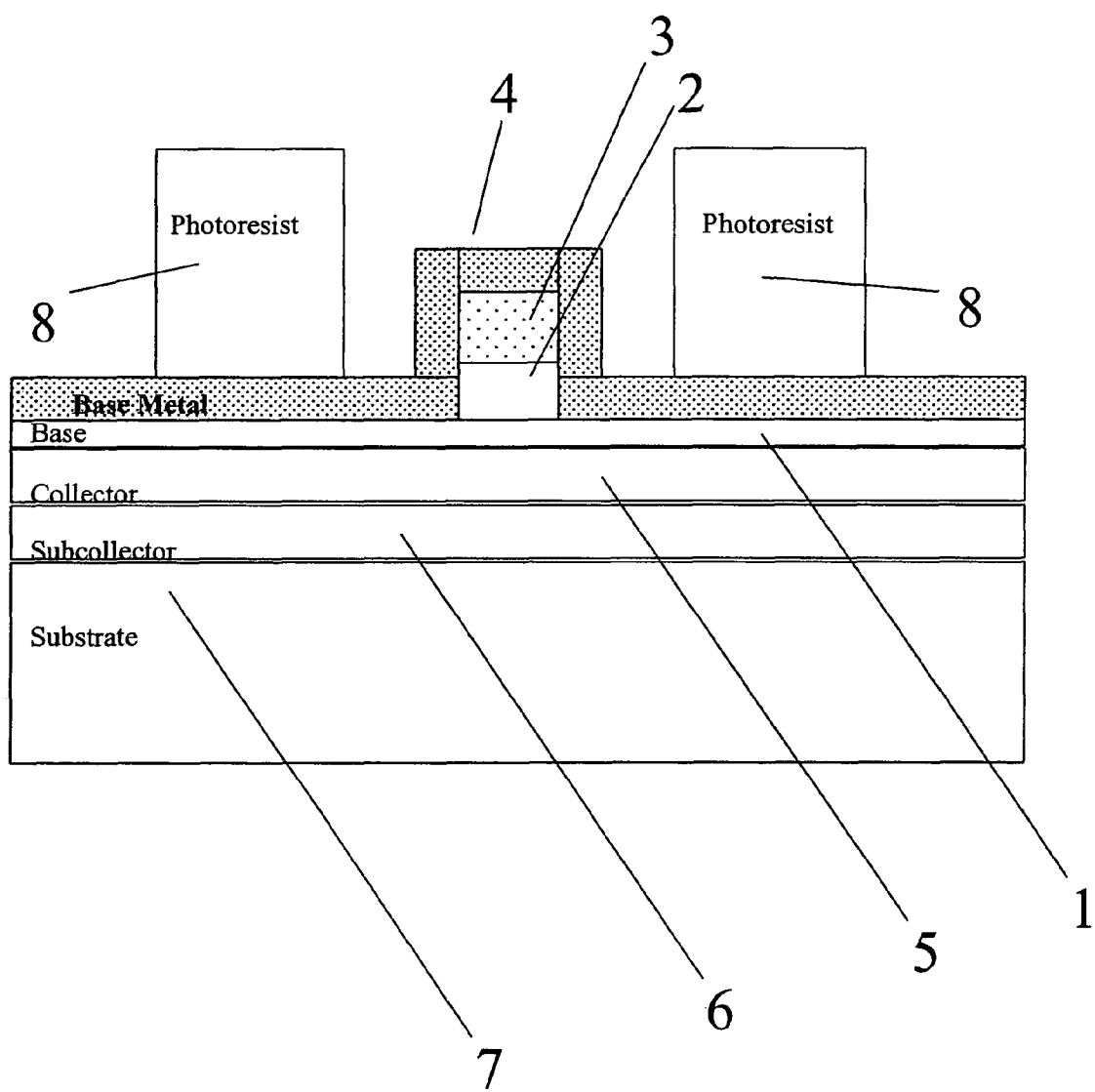
FIG. 20 depicts a cross-sectional view of the layer structure of FIG. 17 after removing the photoresist in the desired areas, according to the present disclosure.
Figure 21:
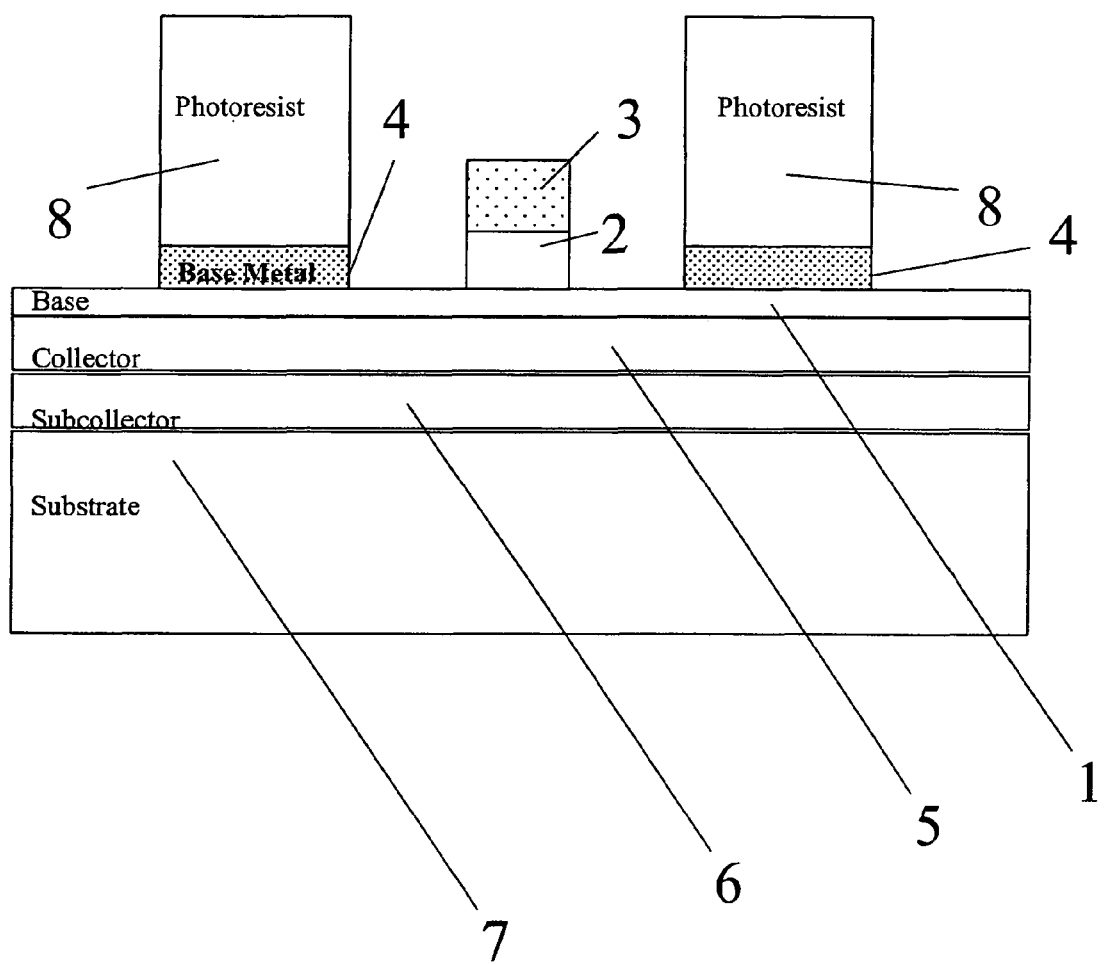
FIG. 21 depicts a cross-sectional view of the layer structure of FIG. 20 after removing base metal not covered by the photoresist layer, according to the present disclosure.

According to another embodiment disclosed herein, the layer structure as shown in FIG. 7a is once again used as the starting structure. In this embodiment, as shown in FIG. 17, a base metal 4 layer is applied on the top surface to cover the entire structure. Next a photoresist layer 8 is applied on top of the base metal 4 layer, as shown in FIG. 18. Two different methods can next be applied to irradiate and remove photoresist layer 8: image reversal photography as shown in FIG. 18, or positive photolithography as shown FIG. 19. Both methods are described in the preceding sections with regard to FIG. 12 and FIG. 13. According to both methods, the mask 9 must be carefully designed so that after removing the non-irradiated photoresist 8 in image reversal photolithography and after removing the irradiated photoresist 8 in the positive photolithography, parts of the base layer 1 are still covered by photoresist layer 8. The distance $p_D$ between the edge of the photoresist 8 covering the base metal 4 and emitter epitaxy 2 and the emitter metal cap 3 as shown in FIG. 20 predetermines the emitter-to-base spacing $x_D$ as shown in FIG. 22. In the next step the base metal layer 4 that is not covered by photoresist 8 is removed, while base metal 4 that is covered by photoresist 8 remains overlying the base 1 as shown in FIG. 21. In the next step the remaining photoresist 8 is removed, as shown in FIG. 22. This embodiment also produces an emitter electrode that is not covered by base metal 4.

The emitter resistance is composed of many constituent parts. Contact resistance depends upon the material and doping characteristics of the epitaxial layer as well as the quality of metal-semiconductor interface. One of the epitaxial layers that comprise the emitter epitaxy stack is the emitter contact layer. This layer as well as the lightly doped portion of the emitter layer are very thick in current, state of the art HBT devices. From an electrical point of view, the emitter resistance is a series resistance of conduction vertically through these layers to the emitter metal layer. For a given set of doping levels in these layers, a method of significantly reducing the emitter resistance is to simply thin these layers.

The emitter contact resistance depends upon the material and doping characteristics of the epitaxial layer as well as the quality of metal-semiconductor interface. These factors being constant, the emitter resistance depends primarily on area of the metal-semiconductor pattern following the equation:

$$R_{cont} = r_{sheet} \times A_e \quad \text{(equation 1)}$$

Where $R_{cont}$ is the emitter contact resistance, $r_{sheet}$ is the sheet resistivity of the emitter contact layer, and $A_e$ is the emitter metal contact area. As such, the linear relationship of emitter resistance in equation 1 above does not hold for devices when they are scaled to emitter sizes below 0.5 μm.

An advantage conferred by the present embodiments is the ability to scale the emitter epitaxial layers vertically (thinner) arbitrarily as required by the device designer. The emitter epitaxy stack thickness in state of the art self-aligned HBTs is determined primarily by the need to avoid emitter to base metal shorts during base metal deposition. The present embodiments, however, may be formed with substantially thinner emitter epitaxy layers 2, as there is no longer any need for the emitter metal cap 3 to be disposed vertically higher than the base metal. Scaling of the emitter epitaxy layers allows the designer to choose emitter resistance and capacitance values optimized for circuit and/or device performance.

A further advantage of the present embodiments lies in that the emitter may be formed using only dry etching, which results in an emitter epitaxial layer 2 with vertical walls that are contiguous and co-planar with the vertical walls of the emitter metal cap 3, that is, the emitter epitaxial layer 2 has substantially the same width or horizontal dimensions as the overlying emitter metal cap 3. This anisotropic (one-directional) etching technique therefore provides for more of the emitter epitaxy to be in contact with the emitter metal, thereby reducing emitter resistance and significantly improving device performance. Dry etching will also result in improved uniformity in view of the variable nature of wet etching.

Figure 25:
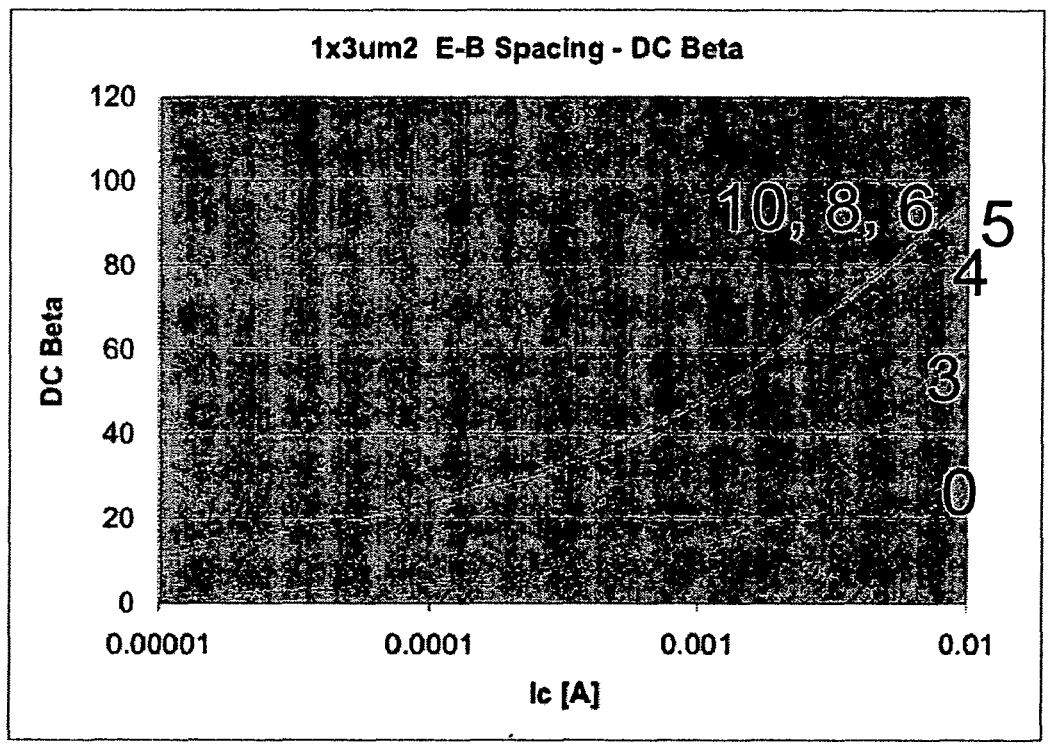
FIG. 25 depicts plots of measurements (DC Beta versus $I_c$ [A]) for several non-self-aligned InP HBT devices according to the present disclosure and having different emitter-to-base spacings $x_p$.

Non-self-aligned HBT devices may be prepared with different emitter metal to base metal spacings ($X_D$). FIG. 25 shows a plot of seven curves 0 ($x_D$=0 μm), 3 ($x_D$=0.3 μm), 4 ($x_u$=0.4 μm), 5 ($x_D$=0.5 μm), 6 ($x_D$=0.6 μm), 8 ($x_D$=0.8 μm), 10 ($x_u$=1.0 μm) of DC Beta versus Ic [A]. (Collector Current). The spacing is between the emitter metal and the base metal, the Emitter pedestal and the closest edge of the base metal ($X_D$). 0 and 3 result in a much lower DC Beta versus collector current than 4-10. The differences in the measured values for DC Beta versus Ic [A] are small between 4, 5, 6, 8 and 10. For distances greater than 0.4 microns diminishing returns are observed.

Figure 26:
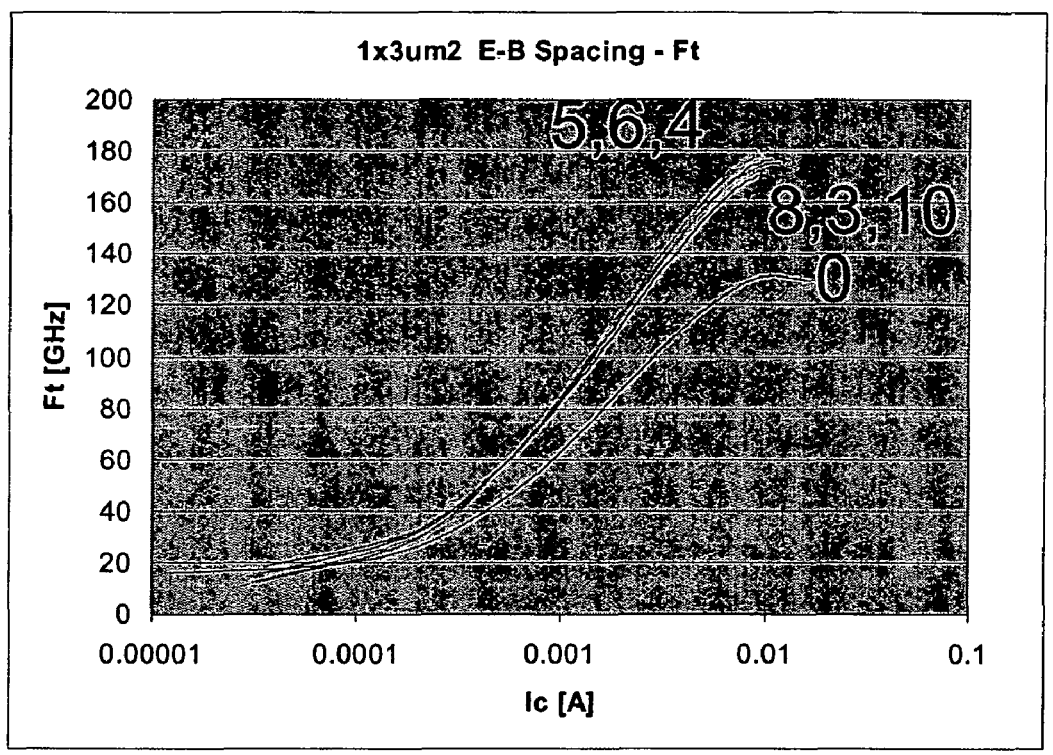
FIG. 26 depicts plots of measurements ($F_t$ [GHz] versus $I_c$ [A]) for several non-self-aligned InP HBT devices according to the present disclosure and with different emitter-to-base spacings $x_t$).

FIG. 26 shows a plot (0, 3, 4, 5, 6, 8, 10) of the same devices as shown in FIG. 25 of $F_t$ [GHz] (unity gain transfer frequency) versus $I_c$ [A]. The 0 curb represents the self-aligned emitter base heterojunction device, which is the prior art (emitter base spacing of 0 μm is prior art.). The Fts of 3, 4, 5, 6, 8 and 10 are higher than 0 but there is not a big difference between the Fts of 3, 4, 5, 6, 8 and 10. Generally the distance makes the effect and it doesn't make a big difference between 0.3 and 1.0 microns. In terms of Ft, which is the unity gain transfer frequency, there is no difference in the emitter base spacing of the criteria, just greater than 0.

Figure 27:
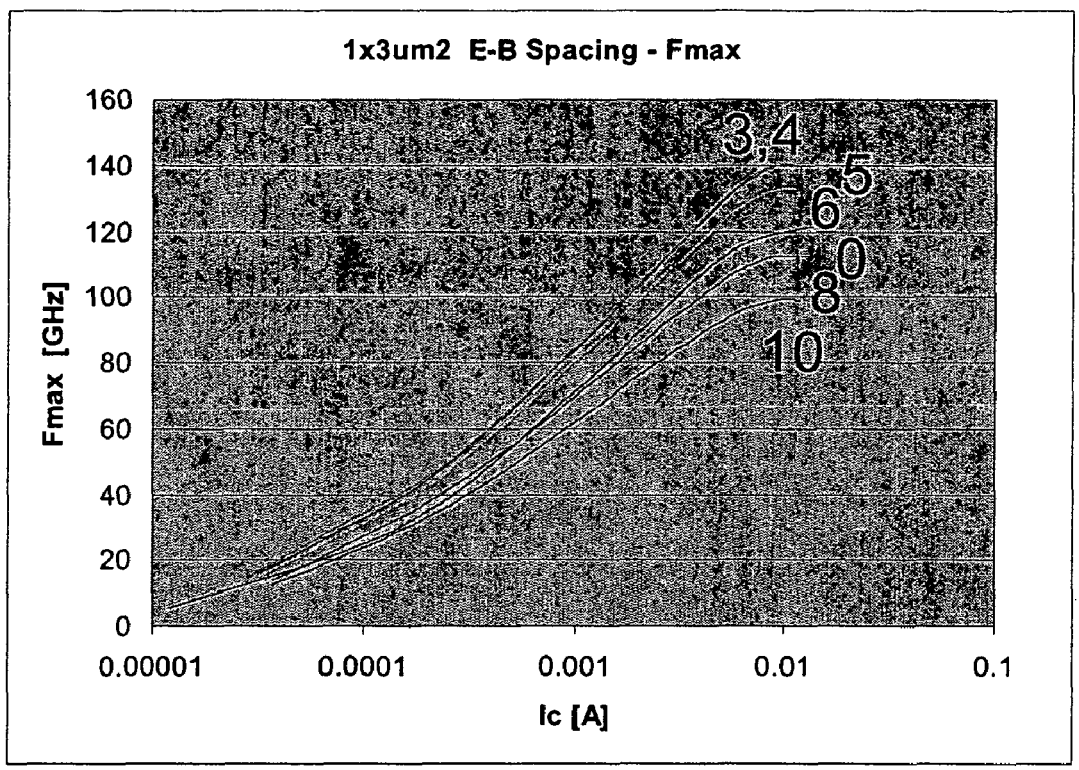
FIG. 27 depicts plots of measurements ($F_{max}$ [GHz] versus $I_c$ [A]) for several non-self-aligned InP HBT devices according to the present disclosure and with different emitter-to-base spacings $x_t$).

FIG. 27 shows a plot ($F_{max}$ [GHz] versus $I_C$ [A]) frequency max versus collector current. $F_{max}$ is the maximum oscillation frequency. $F_{max}$ has the highest value for the 0.3 μm and 0.4 μm spacing and peaks at about 140 GHz. This shows that the smaller emitter base spacing gives a better device. The smallest emitter base spacing 0.3 μm that is in this measured data gave the best $F_{max}$. It's very probable that if data were available for devices with emitter-base spacing equal to 0.2 or 0.1 that they would be even higher. The tendency shows that the smaller the emitter-base spacing, the better the device gets. At 0.3, 0.4, 0.5, 0.6 then it goes down. The 0 device is a self-aligned device just by nature of the way the device is fabricated creates leakage currents, which adversely affect device performance. But comparing the self-aligned device according to the prior art to the disclosure here for emitter-base spacing of 0.8 and 1.0 microns prepared according to the disclosure show worse results than according to the prior art with a spacing of 0 μm. With respect to this performance metric, $F_{max}$, in this disclosure should specify emitter-base spacing $\leq 0.7$ μm, preferably $\leq 0.6$ μm and more preferably $\leq 0.5$ μm.

Figure 28:
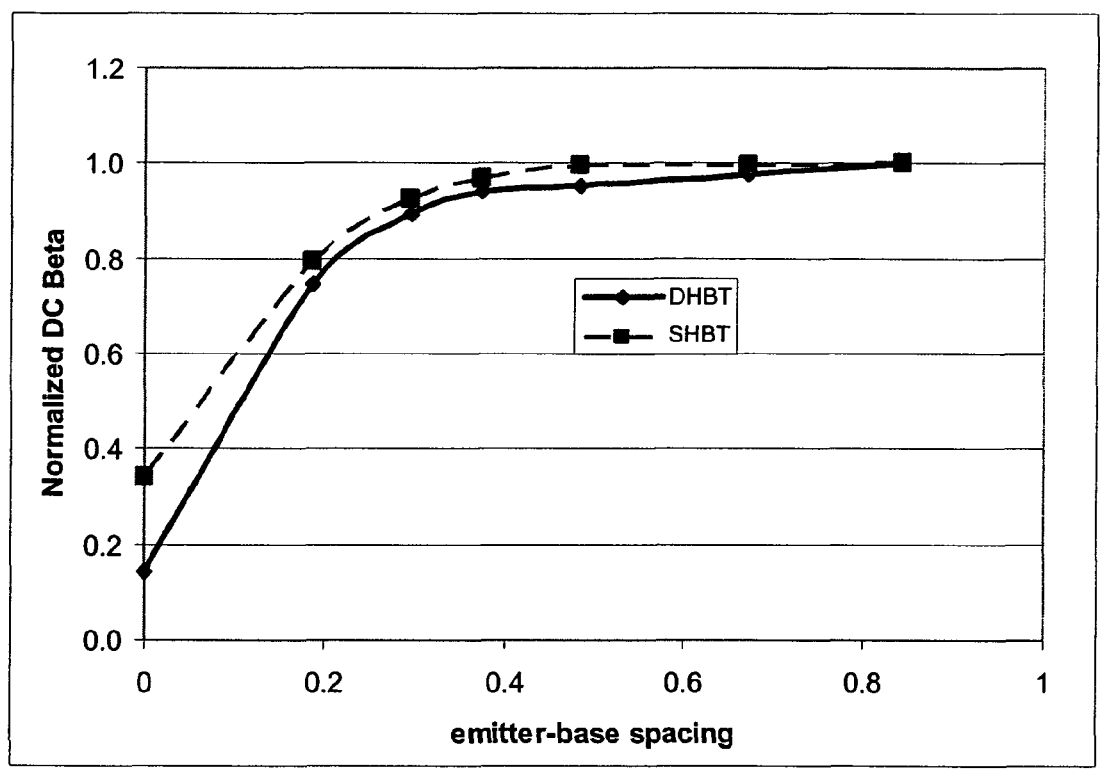
FIG. 28 depicts plots of measurements (normalized DC Beta versus emitter-base spacing $x_D$) for several non-self-aligned InP HBT devices (SHBT and DHBT) according to the present disclosure and with different emitter-to-base spacings $x_D$.

FIG. 28 shows normalized DC Beta versus emitter-base spacing $x_D$. The values of DC Beta are normalized to the peak value measured on the wafer. The units on the x-axis are microns. The two curves are for differing types of HBT devices (SHBT=Single Heterojunction Bipolar Transistor and DHBT=Double Heterojunction Bipolar Transistor). The two curves used the disclosure non-self-aligned layouts. The two types of devices differ only by their base-collector junction. The SHBT has a homojunction at the base-collector while the DHBT has a heterojunction. The DHBT devices used InP as the collector material as opposed to InGaAs for the SHBT devices. However, both the SHBT and DHBT devices have in common the emitter-base junction, according to this disclosure. This figure shows that the same phenomenon happens for both types of HBT devices (SHBT and DHBT). If the base metal is moved closer and closer to the emitter pedestal, the normalized DC Beta is stabile until about 0.2 μm to 0.3 μm, then there is a cliff and the device gain falls off precipitously. This figure shows that in terms of device gain (DC Beta) values of emitter-base spacing less than ~50 nm should be avoided. The figure shows that the same phenomenon of lateral diffusion of minority in the base happens for both types of devices.

Figure 29:
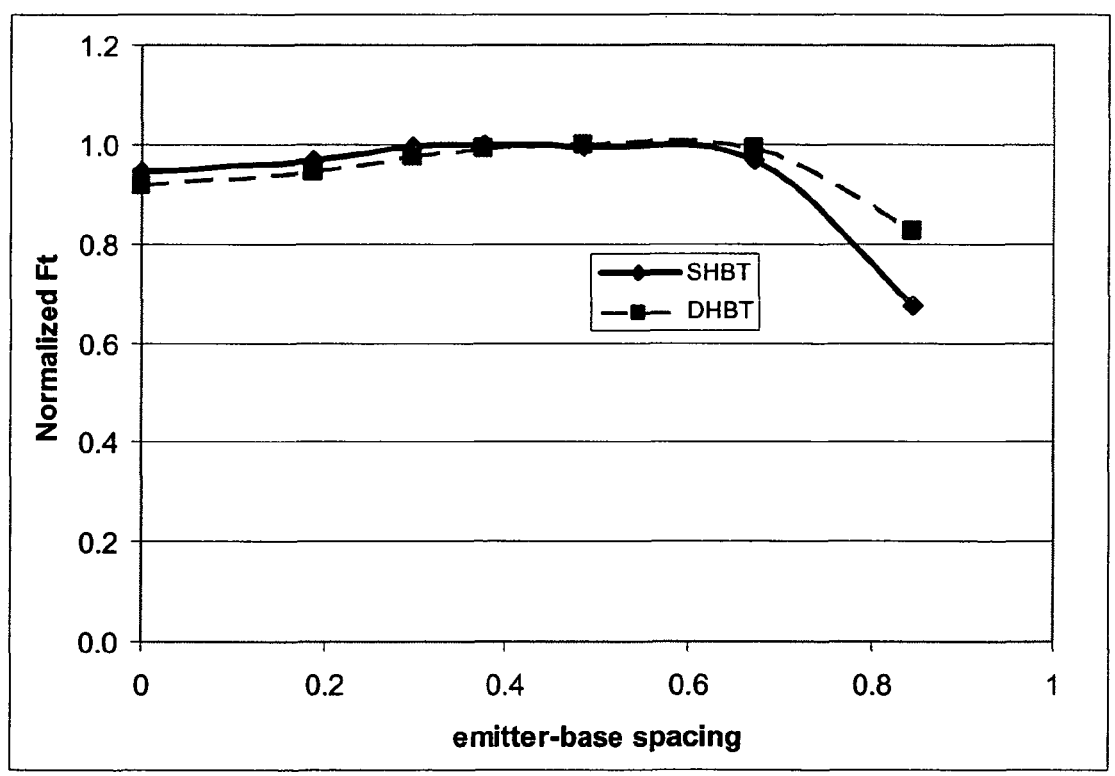
FIG. 29 depicts plots of measurements (normalized Frequency $F_t$ versus emitter-base spacing $x_D$) for several non-self-aligned InP HBT devices (SHBT and DHBT) according to the present disclosure and with different emitter-to-base spacings $x_D$.

FIG. 29 shows a plot of normalized Frequency $F_t$ versus emitter-base spacing $x_D$. The values of $F_t$ are normalized to the peak value measured on the wafer. The units are microns. This figure shows that in terms of $F_t$ that device performance does not suffer significantly for increasing emitter-base spacing until 0.4 μm or 0.6 μm. The values are fairly constant for values of emitter-base spacing between 0.3 μm and 0.6 μm. It can be as far away as 0.6 μm and not suffer in the device performance of $F_t$.

Figure 30:
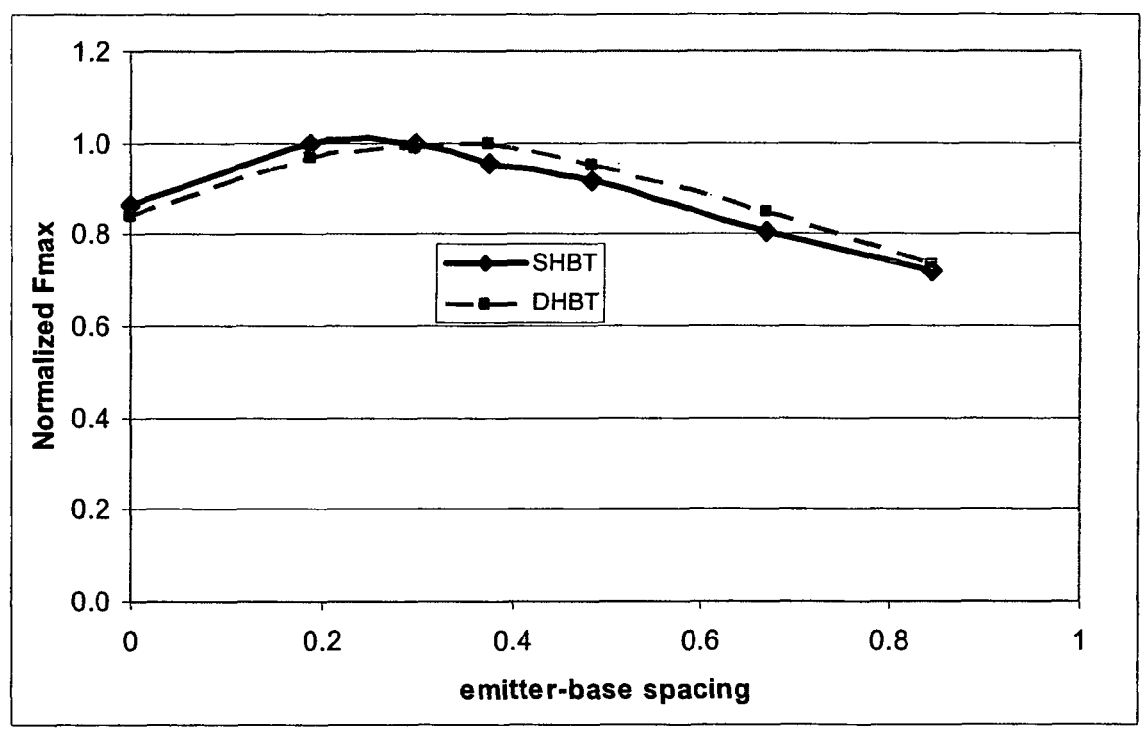
FIG. 30 depicts plots of measurements (normalized Frequency $F_{max}$ versus emitter-base spacing $x_D$) for several non-self-aligned InP HBT devices (SHBT and DHBT) according to the present disclosure and with different emitter-to-base spacings $x_D$).

FIG. 30 shows a plot of normalized Frequency $F_{max}$ versus emitter-base spacing $x_D$. The values of $F_{max}$ are normalized to the peak value measured on the wafer. When the separation between the emitter and the base is greater than 0 the highest $F_{max}$ values are obtained. This is obtained for $x_D$ between 0.1 μm and 0.4 μm, preferably between 0.2 μm and 0.3 μm. Increasing the emitter base spacing of more than 0.6 μm decreases the device performance in terms of $F_{max}$. The measured $F_{max}$ for devices with emitter-base spacing between 0.1 and 0.3 were comparable.

The preferred spacing between the emitter metal and the base metal ($X_D$), which means between the Emitter pedestal and the closest edge of the base metal ($X_D$), is from 0.05 μm to 0.6 μm, preferably from 0.05 μm to 0.5 μm, more preferably from 0.05 μm to 0.3 μm and most preferably from 0.05 μm to 0.15 μm.

The following preferred materials for metals and epitaxy are preferably used within the present disclosure. Any of the materials from each list can be used for each. That is, any metal on the list will work for any of the three contacts and any of the epitaxial materials listed will work for any of the three epitaxy layers.

One or more of the following metals or metal alloys: InGaAs, InAlAs, InAs, InSb, AlInGaAs, InGaSb, GaAs, InP, InGaP, Si or SiGe can preferably be used as Emitter Epitaxy or Base Epitaxy or Collector Epitaxy.

One or more of the following metals or metal alloys: Titanium, Molybdenum, Aluminum, Gold, Platinum, Copper, Gold-, Germanium, Nickel, Tantalum or Tungsten can preferably be used as Emitter Metal or Base Metal or Collector Metal.

One or more of the following metals or metal alloys: Silicon, SiGe, InP, GaAs, SiC, Quartz or Sapphire can preferably be used as Substrates.

Both light (photolithography) and even electron beam (e-beam) lithography are applicable to the disclosure here. With photolithography there is a standard chrome-on-quartz mask used, but any general mask works. The lithography could be either positive photolithography or image reversal photolithography.

The following are examples according to the present disclosure.

Example 1

Image Reversal Lithography Process

A photoresist layer of 1 μm was applied on the top surface of a layer structure (wafer) with emitter epitaxy and emitter metal as shown in FIG. 7. A photoresist SPR 955-1.1 of Shipley Company was applied as a liquid by spin-on processing to the wafer. The wafer was then heated on a hot plate by 90° C. for 60 seconds. The wafer was then exposed to a light through a mask as shown in FIG. 12. The light was i-line 365 nm. After the irradiation the wafer was baked in an image reversal oven using $NH_3$ gas at a temperature of 100° C. for 90 minutes. Then the entire wafer was exposed to a broadband illumination without a mask to complete the cross-linking process in the photoresist. Then the wafer was exposed to a photoresist developer MF 321 (Metal Ion Free) of Shipley Company. A wafer was obtained as shown in FIG. 14. Then base metal was deposited on the entire top surface of the wafer as shown in FIG. 15 using the process of thermal evaporation. A base metal was heated until the temperature of evaporation. First a thin layer of titanium as adhesion layer, then platinum as diffusion barrier and finally gold was deposited on the top surface of the wafer. Then the entire wafer was exposed to an acetone bath, wherein the photoresist was removed and a HBT precursor was obtained as shown in FIG. 16.

Example 2

Positive Lithography Process

A photoresist layer of 1 µm was applied on the top surface of a layer structure (wafer) with emitter epitaxy and emitter metal as shown in FIG. 7. A photoresist SPR 955-1.1 of Shipley Company was applied as a liquid by spin-on processing to the wafer. The wafer was then heated on a hot plate by 100° C. for 60 seconds. The wafer was then exposed to a light through a mask as shown in FIG. 13. The light was i-line 365 nm. Then the wafer was exposed to a photoresist developer MF 26A (Metal Ion Free) of Shipley Company. A wafer was obtained as shown in FIG. 14. Then base metal was deposited on the entire top surface of the wafer as shown in FIG. 15 using the process of thermal evaporation. A base metal was heated until the temperature of evaporation. First a thin layer of titanium as adhesion layer, then platinum as diffusion barrier and finally gold was deposited on the top surface of the wafer. Then the entire wafer was exposed to an acetone bath, wherein the photoresist was removed and a HBT precursor was obtained as shown in FIG. 16.

Although the description above contains much specificity, this should not be construed as limiting the scope of the disclosure but as merely providing illustrations of some of the presently preferred embodiments of this disclosure. For example the processes described above can involve additional or fewer steps, that may be executed in a different order than that disclosed.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A method for fabricating a heterojunction bipolar transistor (HBT), comprising:
   providing a structure comprising sequentially a substrate, a collector layer for the HBT, a base layer for the HBT, an epitaxial layer, and an emitter metal layer for the HBT;
   etching the emitter metal layer and the epitaxial layer to form an emitter electrode comprised of an emitter epitaxy pedestal underlying an emitter metal cap and having horizontal dimensions that are equal to the emitter metal cap;
   depositing a photoresist layer over the emitter electrode and onto the base layer and in direct contact with the base layer;
   masking the photoresist layer with a mask that exposes an area over and a predetermined distance away from the emitter electrode;
   irradiating the photoresist layer through the mask;
   removing the exposed photoresist layer to expose a portion of the base layer that is spaced the predetermined distance away from the emitter electrode;
   depositing base metal over the structure; and
   removing the remainder of the photoresist layer together with the base metal deposited thereupon;
   wherein the predetermined distance is between 0.05 µm and 0.2 µm; and
   wherein one or more of the emitter epitaxy and base layer comprise one or more of InGaAs, InAlAs, InAs, InSb, AlInGaAs, InGaSb, InP, Si and SiGe.

2. The method of claim 1, wherein the photoresist that is shielded by the mask from being irradiated is subsequently removed to expose the base layer.

3. The method of claim 1, wherein the photoresist layer is irradiated with light or an electron beam.

4. The method of claim 1, wherein one or more of the emitter epitaxy, base layer and collector layer comprise one or more of InGaAs, InAlAs, InAs, InSb, AlInGaAs, InGaSb, InP, Si and SiGe.

5. The method according to claim 1, wherein one or more of the emitter metal, base metal and collector metal comprise one or more of Titanium, Molybdenum, Aluminum, Gold, Platinum, Copper, Gold-Germanium, Nickel, Tantalum and Tungsten.

6. The method according to claim 1, wherein the substrate comprises one or more of Silicon, SiGe, InP, GaAs, SiC, Quartz and Sapphire.

7. A heterojunction bipolar transistor prepared according to the method of claim 1.

8. The method according to claim 1, wherein the base metal is deposited to a height above the top of the emitter epitaxy pedestal.

9. A method for fabricating a heterojunction bipolar transistor (HBT), comprising:
   providing a structure comprising sequentially a substrate, a collector layer for the HBT, a base layer for the HBT, an epitaxial layer, and an emitter metal layer for the HBT;
   etching the emitter metal layer and the epitaxial layer to form an emitter electrode comprised of an emitter epitaxy pedestal underlying an emitter metal cap and having horizontal dimensions that are equal to the emitter metal cap;
   depositing a photoresist layer over the emitter electrode and onto the base layer and in direct contact with the base layer;
   masking the photoresist layer with a mask that masks an area over and a predetermined distance away from the emitter electrode;

irradiating the photoresist layer through the mask;

removing the masked photoresist layer to expose a portion of the base layer that is spaced the predetermined distance away from the emitter electrode;

depositing base metal over the structure; and removing the remainder of the photoresist layer together with the base metal deposited thereupon;

wherein the predetermined distance is between 0.05 μm and 0.2 μm; and wherein one or more of the emitter epitaxy and base layer comprise one or more of InGaAs, InAlAs, InAs, InSb, AlInGaAs, InGaSb, InP, Si and SiGe.

10. The method of claim 9, wherein the photoresist that is not masked is subsequently removed to expose the base layer.

11. The method of claim 9, wherein the photoresist layer is irradiated with light or an electron beam.

12. The method of claim 9, wherein one or more of the emitter epitaxy, base layer and collector layer comprise one or more of InGaAs, InAlAs, InAs, InSb, AlInGaAs, InGaSb, InP, Si and SiGe.

13. The method of claim 9, wherein one or more of the emitter metal, base metal and collector metal comprise one or more of Titanium, Molybdenum, Aluminum, Gold, Platinum, Copper, Gold-Germanium, Nickel, Tantalum and Tungsten.

14. The method of claim 9, wherein the substrate comprises one or more of Silicon, SiGe, InP, GaAs, SiC, Quartz and Sapphire.

15. A heterojunction bipolar transistor prepared according to the method of claim 9.

16. The method according to claim 9, wherein the base metal is deposited to a height above the top of the emitter epitaxy pedestal.

* * * * *